(12) United States Patent
Lin et al.

(10) Patent No.: US 9,200,973 B2
(45) Date of Patent: Dec. 1, 2015

(54) SEMICONDUCTOR PACKAGE WITH AIR PRESSURE SENSOR

(75) Inventors: Kevin L. Lin, Beaverton, OR (US); Qing Ma, Saratoga, CA (US); Feras Eid, Chandler, AZ (US); Johanna Swan, Scottsdale, AZ (US); Weng Hong Teh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 521 days.

(21) Appl. No.: 13/536,210

(22) Filed: Jun. 28, 2012

(65) Prior Publication Data

US 2014/0000377 A1    Jan. 2, 2014

(51) Int. Cl.
- *G01L 9/16* (2006.01)
- *G01L 9/00* (2006.01)
- *B81B 7/00* (2006.01)
- *B81C 1/00* (2006.01)
- *H01L 29/84* (2006.01)

(52) U.S. Cl.
CPC .............. *G01L 9/0042* (2013.01); *B81B 7/0077* (2013.01); *B81C 1/00246* (2013.01); *G01L 9/007* (2013.01); *G01L 9/0047* (2013.01); *G01L 9/0073* (2013.01); *B81B 2201/0264* (2013.01); *H01L 29/84* (2013.01)

(58) Field of Classification Search
None
See application file for complete search history.

(56) References Cited

U.S. PATENT DOCUMENTS

| | | | |
|---|---|---|---|
| 5,698,784 A | 12/1997 | Hotelling et al. | |
| 5,883,779 A | 3/1999 | Catanescu et al. | |
| 6,982,859 B1 | 1/2006 | Whitney | |
| 2005/0013281 A1 | 1/2005 | Milton et al. | |
| 2005/0132814 A1 | 6/2005 | Satou et al. | |
| 2007/0025092 A1* | 2/2007 | Lee et al. | 361/761 |
| 2007/0177316 A1 | 8/2007 | Hotelling et al. | |
| 2008/0142606 A1 | 6/2008 | Wu | |
| 2008/0174781 A1 | 7/2008 | Berthold et al. | |
| 2009/0027748 A1 | 1/2009 | Sprague et al. | |
| 2009/0127590 A1 | 5/2009 | Shimada | |
| 2012/0120022 A1 | 5/2012 | Cheng et al. | |
| 2012/0161278 A1 | 6/2012 | Meyer et al. | |
| 2014/0002178 A1 | 1/2014 | Teh et al. | |

(Continued)

FOREIGN PATENT DOCUMENTS

| | | |
|---|---|---|
| CN | 1011271693 | 2/2012 |
| JP | 2001194153 | 7/2001 |
| JP | 2006170785 | 6/2006 |
| KR | 100511926 | 8/2005 |
| KR | 20080101010 | 11/2008 |

OTHER PUBLICATIONS

Teh, Weng Hong et al., "Heterogeneous Integration of Micorfluidic Devices in Package Structures", U.S. Appl. No. 13/624,288, filed Sep. 21, 2012 45 pgs.

(Continued)

*Primary Examiner* — Andre Allen
(74) *Attorney, Agent, or Firm* — Blakely, Sokoloff, Taylor & Zafman LLP

(57) ABSTRACT

A semiconductor package having an air pressure sensor and methods to form a semiconductor package having an air pressure sensor are described. For example, a semiconductor package includes a plurality of build-up layers. A cavity is disposed in one or more of the build-up layers. An air pressure sensor is disposed in the plurality of build-up layers and includes the cavity and an electrode disposed above the cavity. Also described are various approaches to fabricating a semiconductor package having a hermetically sealed region.

14 Claims, 25 Drawing Sheets

(56) References Cited

U.S. PATENT DOCUMENTS

2014/0353827 A1* 12/2014 Liu et al. .................. 257/751
2015/0048515 A1*  2/2015 Zhang et al. .............. 257/774
2015/0183635 A1*  7/2015 Lee et al. .................. 257/419

OTHER PUBLICATIONS

Ma, Qing et al., "Accelerometer and Method of Making Same", U.S. Appl. No. 13/618,003, filed Sep. 14, 2012 29 pgs.

International Search Report and Written Opinion from PCT/US2013/046635 mailed Sep. 25, 2013, 12 pgs.

International Search Report and Written Opinion from PCT/US2013/044354 mailed Sep. 13, 2013, 9 pgs.

International Preliminary Report on Patentablity from PCT/US2013/045026 mailed Jan. 8, 2015, 9 pages.

International Search Report and Written Opinion for PCT Patent Application No. PCT/US2013/045026, mailed Nov. 20, 2013, 12 pgs.

Search Report from Taiwan Patent App. No. 102121931 dated Mar. 24, 2015 1 pgs.

* cited by examiner

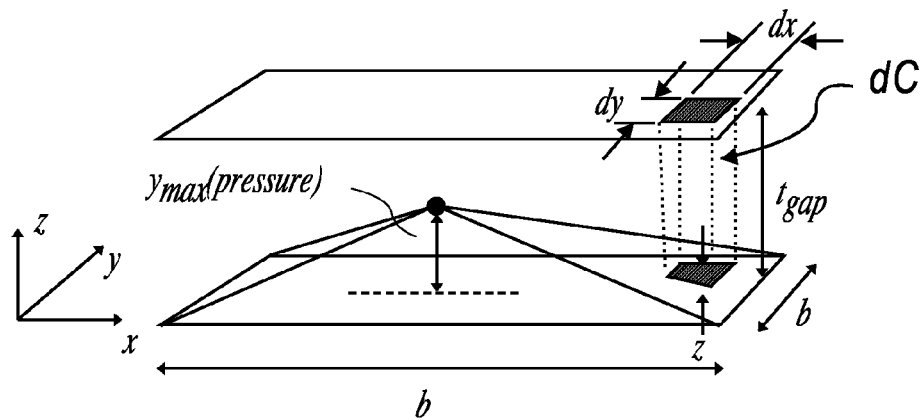

$$y_{max}(pressure) = \frac{0.0138 \cdot pressure \cdot b^4}{E \cdot t^3} \quad \sim 606$$

$$dC = \frac{EdA}{t_{gap} - Z} = \frac{Edxdy}{t_{gap} - Z} \quad \sim 608$$

$$Z = \frac{y}{\frac{b}{2}} \cdot \frac{y}{\frac{b}{2}} \cdot y_{max} = \frac{4xy}{b^2} \frac{0.0138 \cdot pressure \cdot b^4}{E \cdot t^3} = 4xy \frac{0.0138 \cdot pressure \cdot b^2}{E \cdot t^3} \quad \sim 610$$

$$C_{total} = \iint dC = 4\iint_0^{\frac{b}{2}} \frac{E}{t_{gap} - Z} \, dxdy \quad \sim 612$$

$$C_{total} = 4\iint_0^{\frac{b}{2}} \frac{E}{t_{gap} - 4xy \frac{0.0138 \cdot pressure \cdot b^2}{E \cdot t^3}} \, dxdy \quad \sim 614$$

FIG. 6B

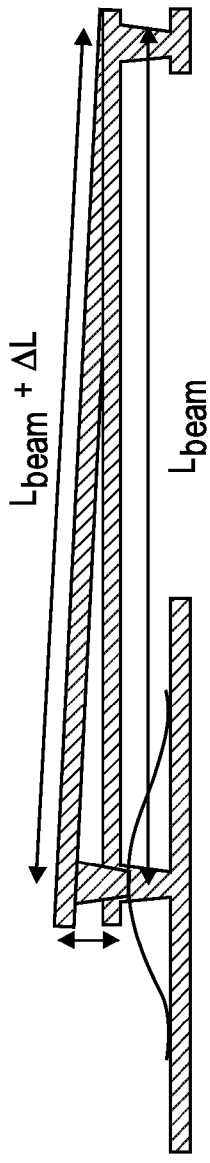

$$Z_{max}(pressure) = \frac{0.0138 \cdot pressure \cdot b^4}{E \cdot t^3} \quad (902)$$

$$f_{c0} = \frac{1}{2\pi}\sqrt{\frac{k_0}{m_{coil}}} = \frac{1}{\pi}\sqrt{\frac{Ew^3 t}{m_{coil}(\frac{L}{2})^3}} \quad (906)$$

$$f_c = f_{c0}\left(1 + \frac{L}{4w^2}\Delta L\right)^{\frac{1}{2}} \quad (908)$$

$$(L_0 + \Delta L)^2 = L_0^2 + \Delta z^2 \quad (910)$$
$$\Delta L^2 + 2L_0 DL = \Delta z^2$$

$$\Delta L \approx \frac{\Delta z^2}{2L_0} \quad because \ (\Delta L^2 << 2L_0 \Delta L) \quad (912)$$

$$f_c = f_{c0}\left(1 + \frac{L}{4w^2}\Delta L\right)^{\frac{1}{2}} = f_{c0}\left(1 + \frac{\Delta z^2}{8w^2}\right)^{\frac{1}{2}} \quad (914)$$

FIG. 9

SEMICONDUCTOR PACKAGE WITH AIR PRESSURE SENSOR

TECHNICAL FIELD

Embodiments of the invention are in the field of semiconductor packages and, in particular, semiconductor packages with air pressure sensors.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Furthermore, for the past several years, microelectromechanical systems (MEMS) structures have been playing an increasingly important role in consumer products. For example, MEMS devices, such as sensors and actuators, can be found in products ranging from inertial sensors for air-bag triggers in vehicles to micro-mirrors for displays in the visual arts industry and, more recently, in mobile applications such as air pressure sensors for altitude sensing. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

Although packaging scaling is typically viewed as a reduction in size, the addition of functionality in a given space is also considered. However, structural issues may arise when attempting to package semiconductor die with additional functionality also housed in the package. For example, the addition of packaged MEMS devices may add functionality, but ever decreasing space availability in a semiconductor package may provide obstacles to adding such functionality.

BRIEF DESCRIPTION OF THE DRAWINGS

FIGS. 6A and 6B illustrate schematics and equations for determining analytical calculations for sensing air pressure in a capacitive manner, in accordance with an embodiment of the present invention.

FIG. 9 illustrates schematics and equations for determining analytical calculations for sensing air pressure for a magnetically-actuated resonant beam air pressure sensor, in accordance with an embodiment of the present invention.

DESCRIPTION OF THE EMBODIMENTS

Figure 1A:
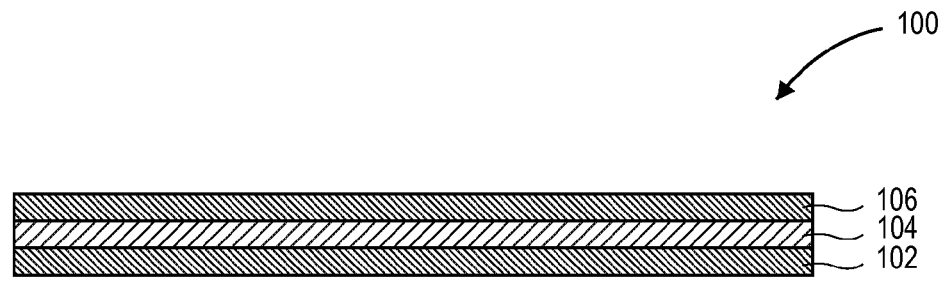
FIGS. 1A-1E illustrate cross-sectional views of various operations in a method of fabricating a reference cavity using a continuous via ring, in accordance with an embodiment of the present invention.

Semiconductor packages with air pressure sensors are described. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to semiconductor packages having one or more microelectromechanical systems (MEMS) structures incorporated therein. In one such embodiment, an air pressure sensor is fabricated in package build-up layers. One or more embodiments pertain to one or more air pressure sensors, bumpless build-up layer (BBUL) packaging, electrostatic sensors, hermetic sealing, magnetically actuated sensors, or MEMS technologies. Structures or devices described herein may have applications in one or more of mobile/consumer products which use BBUL technology.

BBUL embedded packaging technology may be considered for mobile chip packaging technology. Air pressure sensors are important for consumer mobile devices, providing accurate altitude and barometric measurements. Accordingly, in an embodiment, an air pressure sensor is fabricated in or via BBUL technology. As a comparison, conventional air pressure sensors are typically relatively thick compared to a silicon die. Embedding of such sensors into a package for a silicon die may increase package thickness and cost, rendering the overall package less attractive. Furthermore, MEMS-based air pressure sensors typically use a hermetically-sealed pressure chamber to provide a reference air pressure. Accordingly, in an embodiment, air pressure sensors are fabricated directly in BBUL build-up-layers. Compared with embedding silicon based pressure sensors, approach described herein retain a super-thin feature of BBUL, and also mitigate costs associated with separately fabricated air pressure sensors.

Thus, embodiments described herein target building or fabricating air pressure sensors or other MEMS devices using packaging build-up-layers. It is to be understood that a challenge of using such build-up layer technology for air pressure sensors may be a need for the manufacture of a hermetically-sealed package. Due to the porous nature of standard Ajinomoto build-up film (ABF) build-up layers (or other similar laminated materials), laminated ABF layers may not be adequate for forming an air pressure cavity. In order to address such issues, in an embodiment, a copper via ring is used to form a hermetically sealed package for the reference air pressure. The top surface of the sealed package acts as a diaphragm and is the bottom electrode for the electrostatic sensing mechanism. In this arrangement, as the air pressure of the environment changes, sensed capacitance between the two electrodes changes. Sufficient sensitivity may be achieved for the ranges of interest for consumer products. In one embodiment, a "continuous via ring" method is adaptable for other MEMS applications requiring a reference air cavity or hermetic sealing of structures.

Accordingly, a continuous via ring may be fabricated for MEMS-based packaging. For example, FIGS. 1A-1E illustrate cross-sectional views of various operations in a method of fabricating a reference cavity using a continuous via ring, in accordance with an embodiment of the present invention. Such an approach may be used where it is difficult to form a sealed cavity for a pressure sensor by using only ABF, due to the porosity of the ABF material.

Figure 1B:
Figure 1C:
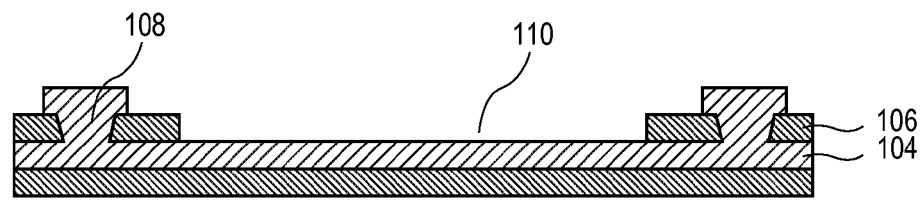
Figure 1D:
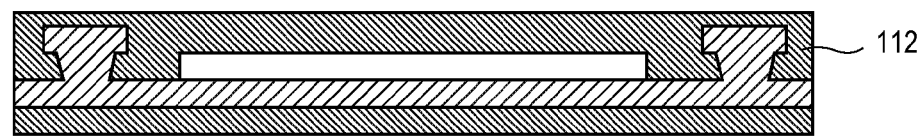
Figure 1E:
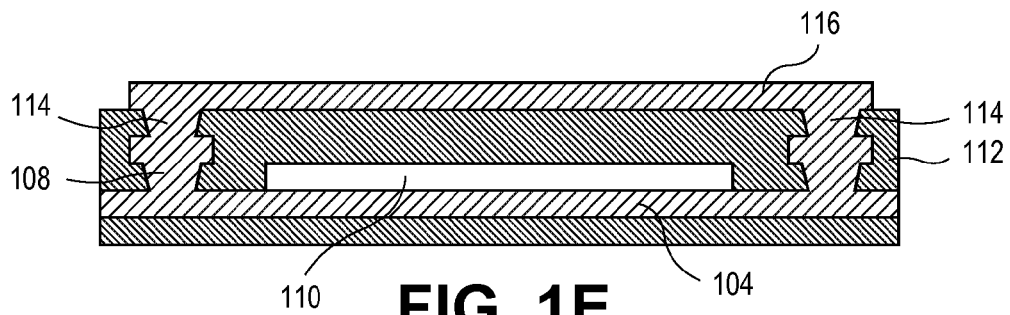

Referring to FIG. 1A, a stack 100 is provided including a first insulating laminate layer 102, a plating layer 104 (e.g. a copper plating layer), and a second insulating laminate layer 106. Vias 108 (e.g., copper vias) are formed through the second insulating laminate layer 106, in contact with the plating layer 104, forming a foundation for a "continuous via ring," as depicted in FIG. 1B. Referring to FIG. 1C, a cavity 110 is formed in second insulating laminate layer 106, between vias 108 and exposing plating layer 104, e.g., by an oxygen plasma etch process. A third insulating laminate layer 112 is then formed over the structure of FIG. 1C, as depicted in FIG. 1D. Referring to FIG. 1E, a continuous via ring is generated by forming second vias 114 in the third insulating laminate layer 112, and forming a top membrane plating layer 116, e.g., a copper membrane plating layer, above the third insulating laminate layer 112. In an embodiment, the copper continuous via ring (from vias 108 and 112), as well as the top copper plating 116 and bottom copper plating 104 form a hermetic seal over the air pressure cavity 110. It is to be understood that where copper is discussed throughout, other similar metals may be used instead Insulating lamination layers described herein may, in an embodiment, refer to alternating conducting and dielectric layers, the latter being, e.g., an ABF or ABF-like layer.

Structural support for ABF lamination may be needed since the large area of the cavity 110 may cause lamination problems and collapse during the lamination process. Thus, efforts may be made to prevent or inhibit cavity collapse in a build-up layer process. As a first example, FIGS. 2A-2E illustrate cross-sectional views of various operations in a first method of fabricating structural support for a reference cavity, in accordance with an embodiment of the present invention.

Figure 2A:
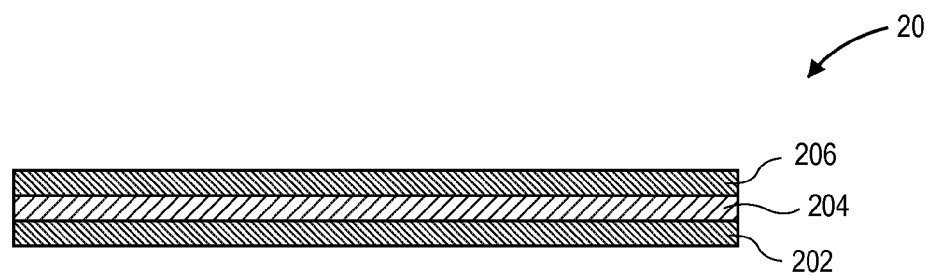
FIGS. 2A-2E illustrate cross-sectional views of various operations in a first method of fabricating structural support for a reference cavity, in accordance with an embodiment of the present invention.
Figure 2B:
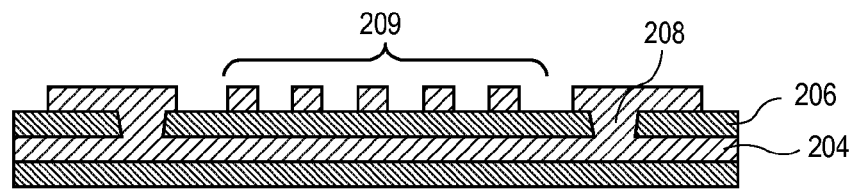
Figure 2C:
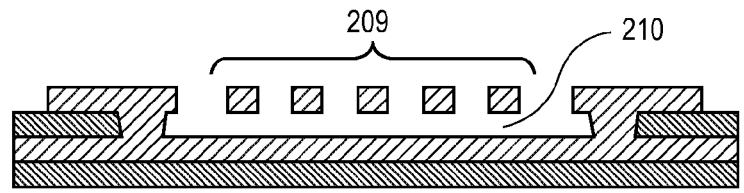
Figure 2D:
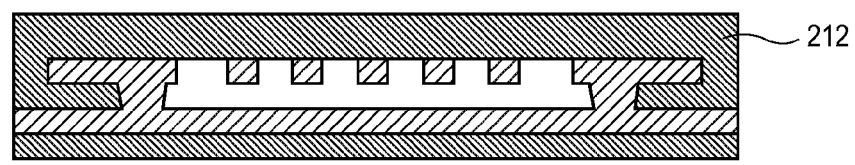
Figure 2E:
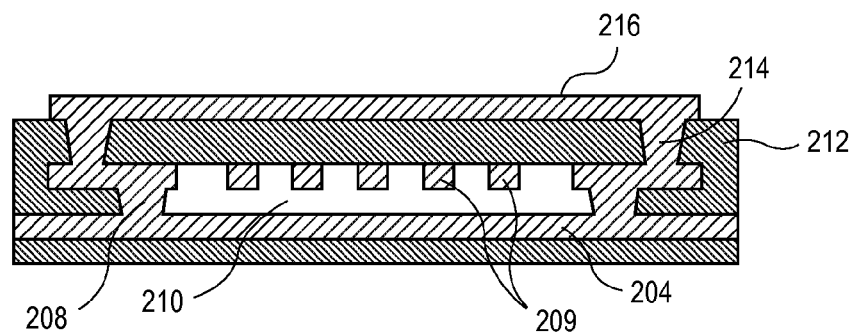

Referring to FIG. 2A, a stack 200 is provided including a first insulating laminate layer 202, a plating layer 204 (e.g. a copper plating layer), and a second insulating laminate layer 206. Vias 208 (e.g., copper vias) are formed through the second insulating laminate layer 206, in contact with the plating layer 204. Additionally, a mesh pattern 209 is formed, as depicted in FIG. 2B. Referring to FIG. 2C, a cavity 210 is formed below the mesh pattern 209, e.g., by an oxygen plasma etch process. A third insulating laminate layer 212 is then formed over the structure of FIG. 2C, as depicted in FIG. 2D. Referring to FIG. 2E, a continuous via ring is generated by forming second vias 214 in the third insulating laminate layer 212, and forming a top membrane plating layer 216, e.g., a copper membrane plating layer, above the third insulating laminate layer 212. In an embodiment, the copper continuous via ring (from vias 208 and 212), as well as the top copper plating 216 and bottom copper plating 204 form a hermetic seal over the air pressure cavity 210. In an embodiment, the cavity 210 is structurally supported by the overlying mesh pattern 209.

As a second example, FIGS. 3A-3F illustrate cross-sectional views of various operations in a second method of fabricating structural support for a reference cavity, in accordance with an embodiment of the present invention.

Figure 3A:
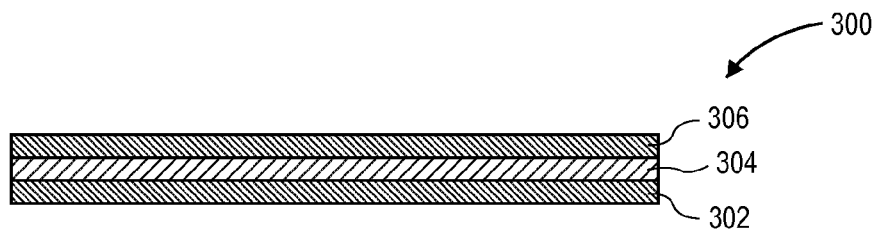
FIGS. 3A-3F illustrate cross-sectional views of various operations in a second method of fabricating structural support for a reference cavity, in accordance with an embodiment of the present invention.
Figure 3B:
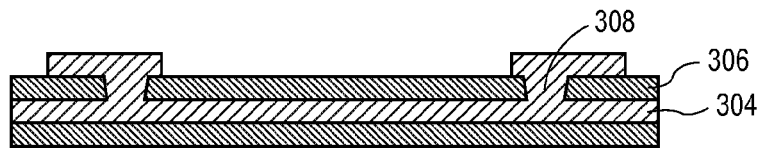
Figure 3C:
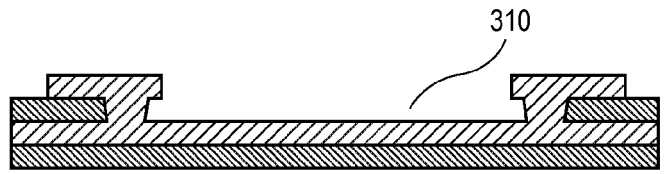
Figure 3D:
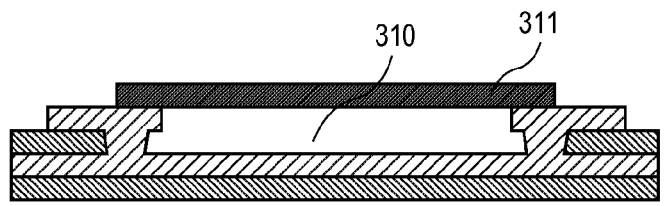
Figure 3E:
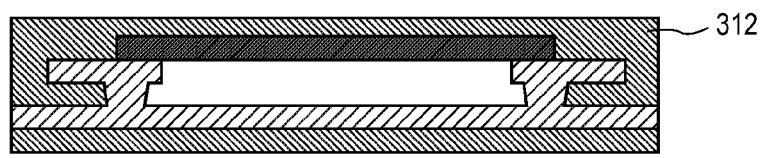
Figure 3F:
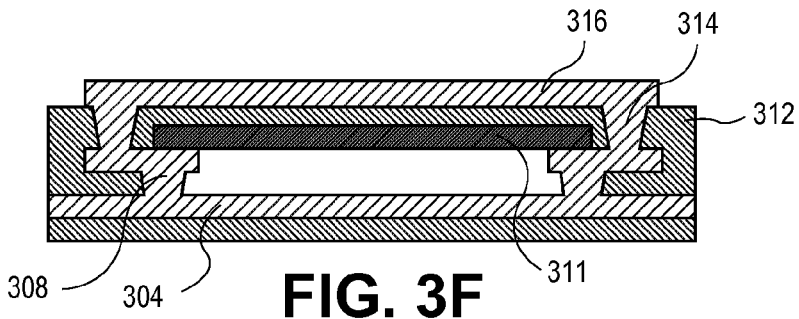

Referring to FIG. 3A, a stack 300 is provided including a first insulating laminate layer 302, a plating layer 304 (e.g. a copper plating layer), and a second insulating laminate layer 306. Vias 308 (e.g., copper vias) are formed through the second insulating laminate layer 306, in contact with the plating layer 304, as depicted in FIG. 3B. Referring to FIG. 3C, a cavity 310 is formed, e.g., by an oxygen plasma etch process. A thin plate 311, e.g., a thin polymeric or metal plate, is then formed or placed over the cavity 310, as depicted in FIG. 3D. Referring to FIG. 3E, a third insulating laminate layer 312 is then formed over the structure of FIG. 3D. A continuous via ring is generated by forming second vias 314 in the third insulating laminate layer 312, and forming a top membrane plating layer 316, e.g., a copper membrane plating layer, above the third insulating laminate layer 312. In an embodiment, the copper continuous via ring (from vias 308 and 312), as well as the top copper plating 316 and bottom copper plating 304 form a hermetic seal over the air pressure cavity 310. In an embodiment, the cavity 310 is structurally supported by the overlying thin plate 311. In one such embodiment, the thin plate 311 has a higher glass transition temperature (Tg) than the ABF cure temperature such that the plate can provide a mechanical shield during ABF lamination. In one embodiment, the thin plate 311 has some adhesion or stiction to copper in order to enable fixing the plate in position during ABF lamination. The seal, however, need not be perfect since the fabricated copper membrane may be relied on for hermeticity.

A capacitive pressure sensor may be fabricated to include a reference cavity as described above. For example, FIGS. 4A-4C illustrate cross-sectional views of various operational states of a pressure sensor having an underlying reference cavity, in accordance with an embodiment of the present invention.

Figure 4A:
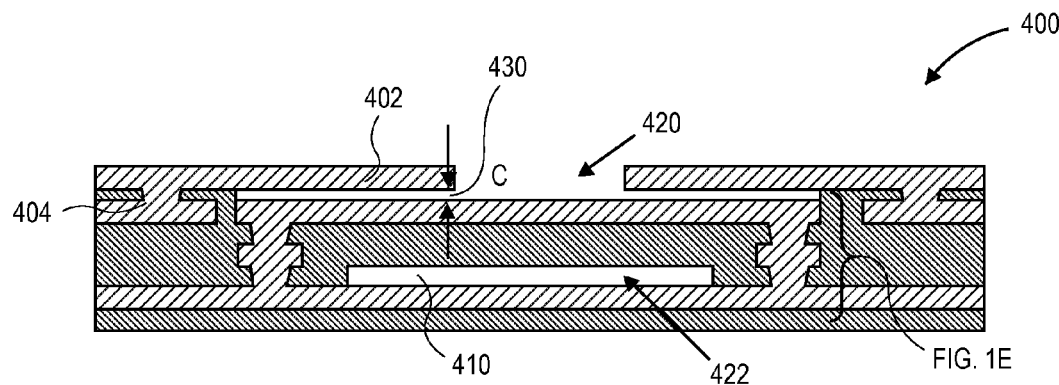
FIGS. 4A-4C illustrate cross-sectional views of various operational states of a pressure sensor having an underlying reference cavity, in accordance with an embodiment of the present invention.
Figure 4B:
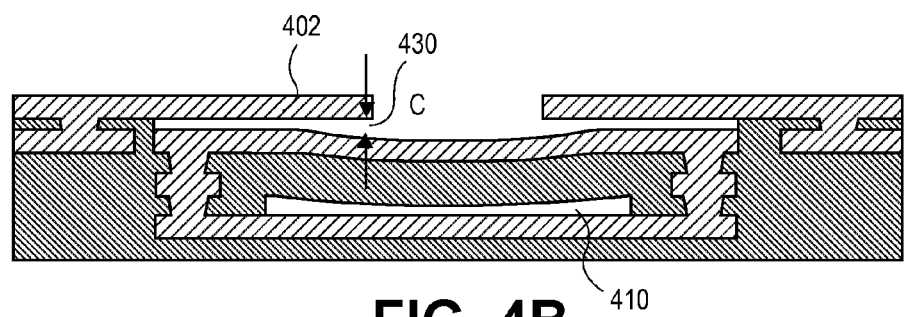
Figure 4C:
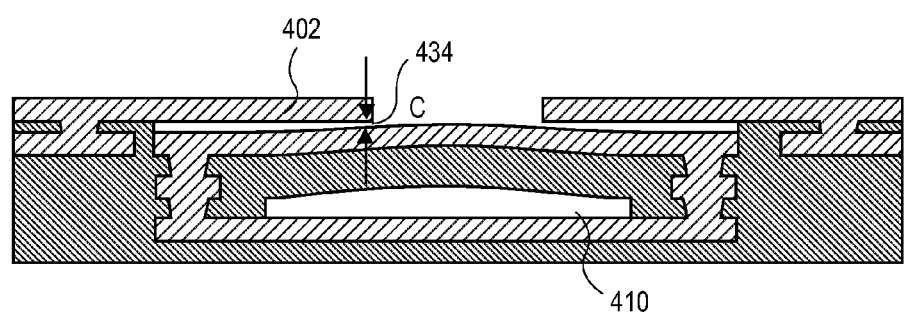

Referring to FIG. 4A, an air pressure sensor 400 is formed from suspended features 402 (e.g., suspended copper features) and electrodes 404 (e.g., copper electrodes) formed above a reference cavity 410. As an example, reference cavity 410 is formed based on the structure of FIG. 1E (as depicted in FIG. 4A) but could be formed based on structures such as those depicted in 2E or 3F as well. The air pressure sensor 400 is able to compare an ambient air pressure 420 with a reference air pressure 422 through capactive coupling (C), as depicted by the arrows in FIGS. 4A-4C.

Referring again to FIG. 4A, the capactive coupling (C) is based on the distance between the suspended member 402 and the underlying structure formed above reference cavity 410. In the case of FIG. 4A, the ambient air pressure 420 is the same as the reference air pressure 422, and the system is effectively at rest with a distance 430 between the suspended member 402 and the underlying structure formed above reference cavity 410 essentially the fabrication height of the two layers. Referring to FIG. 4B, the ambient air pressure 420 is greater than the reference air pressure 422, and the distance 430 between the suspended member 402 and the underlying structure formed above reference cavity 410 is greater than the fabrication height of the two layers. Referring to FIG. 4C, the ambient air pressure 420 is less than the reference air pressure 422, and the distance 434 between the suspended member 402 and the underlying structure formed above reference cavity 410 is less than the fabrication height of the two layers. Thus, in an embodiment, a barometric pressure sensor may be fabricated using a reference air cavity. The difference between ambient air pressure and reference air pressure is detected by an upwards or downwards deflection of the "diaphragm" formed to include the reference cavity. The sensed capacitance reflects the extent of downward or upward deflection of the diaphragm.

Figure 5A:
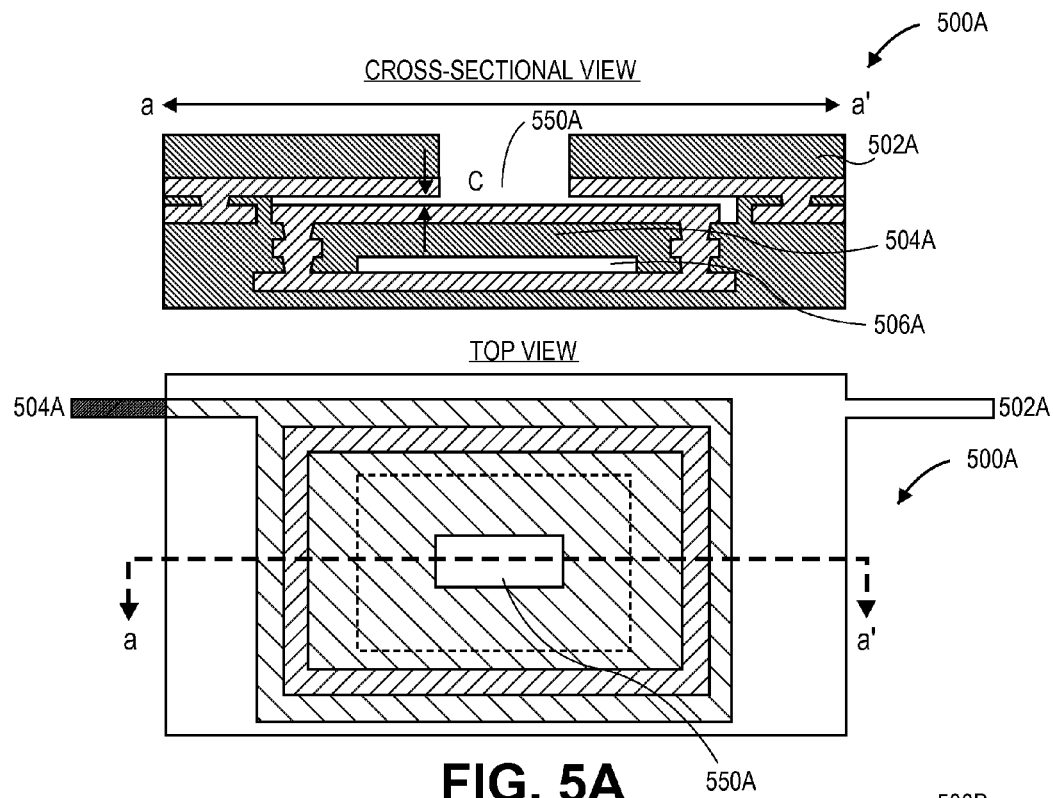
FIG. 5A illustrates a cross-sectional view and corresponding top view of an air pressure sensor having a single large opening to ambient conditions, in accordance with an embodiment of the present invention.

Different configurations may be possible for forming an opening to an air pressure sensor. In a first example, FIG. 5A illustrates a cross-sectional view and corresponding top view of an air pressure sensor having a single large opening to ambient conditions, in accordance with an embodiment of the present invention. Referring to FIG. 5A, an air pressure sensor 500A is formed to include a stiff top layer/electrode 502A, a flexible bottom layer/electrode 504A, and a reference air gap 506A. As an example, air pressure sensor 500A is fabricated based on the structure of FIG. 1E, e.g., as structure 400 of FIG. 4A (as depicted in FIG. 5A) but could be formed based on structures such as those depicted in FIG. 2E or 3F as well. A single opening 550A is included for exposure of the flexible bottom layer/electrode 504A, as depicted in both views of FIG. 5A.

Figure 5B:
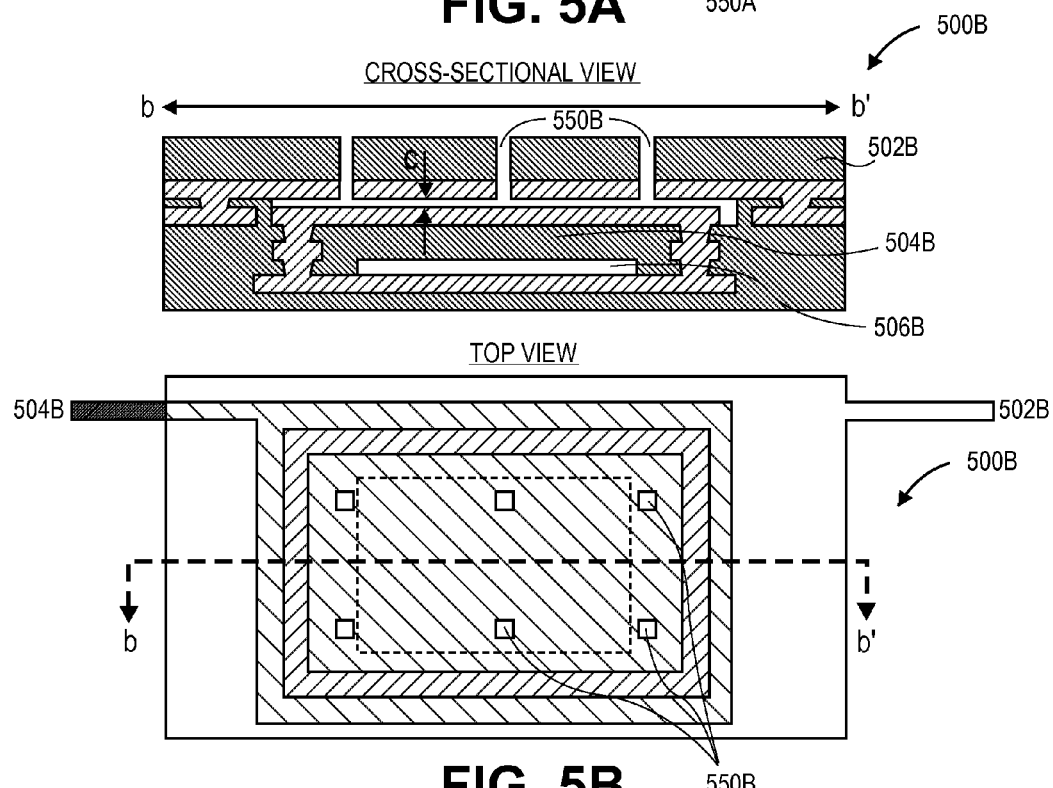
FIG. 5B illustrates a cross-sectional view and corresponding top view of an air pressure sensor having several small openings to ambient conditions, in accordance with an embodiment of the present invention.

In a second example, FIG. 5B illustrates a cross-sectional view and corresponding top view of an air pressure sensor having several small openings to ambient conditions, in accordance with an embodiment of the present invention.

Referring to FIG. 5B, an air pressure sensor 500B is formed to include a stiff top layer/electrode 502B, a flexible bottom layer/electrode 504B, and a reference air gap 506B. As an example, air pressure sensor 500B is fabricated based on the structure of FIG. 1E, e.g., as structure 400 of FIG. 4A (as depicted in FIG. 5B) but could be formed based on structures such as those depicted in FIG. 2E or 3F as well. A plurality of openings 550B is included for exposure of the flexible bottom layer/electrode 504B, as depicted in both views of FIG. 5B.

Figure 6A:
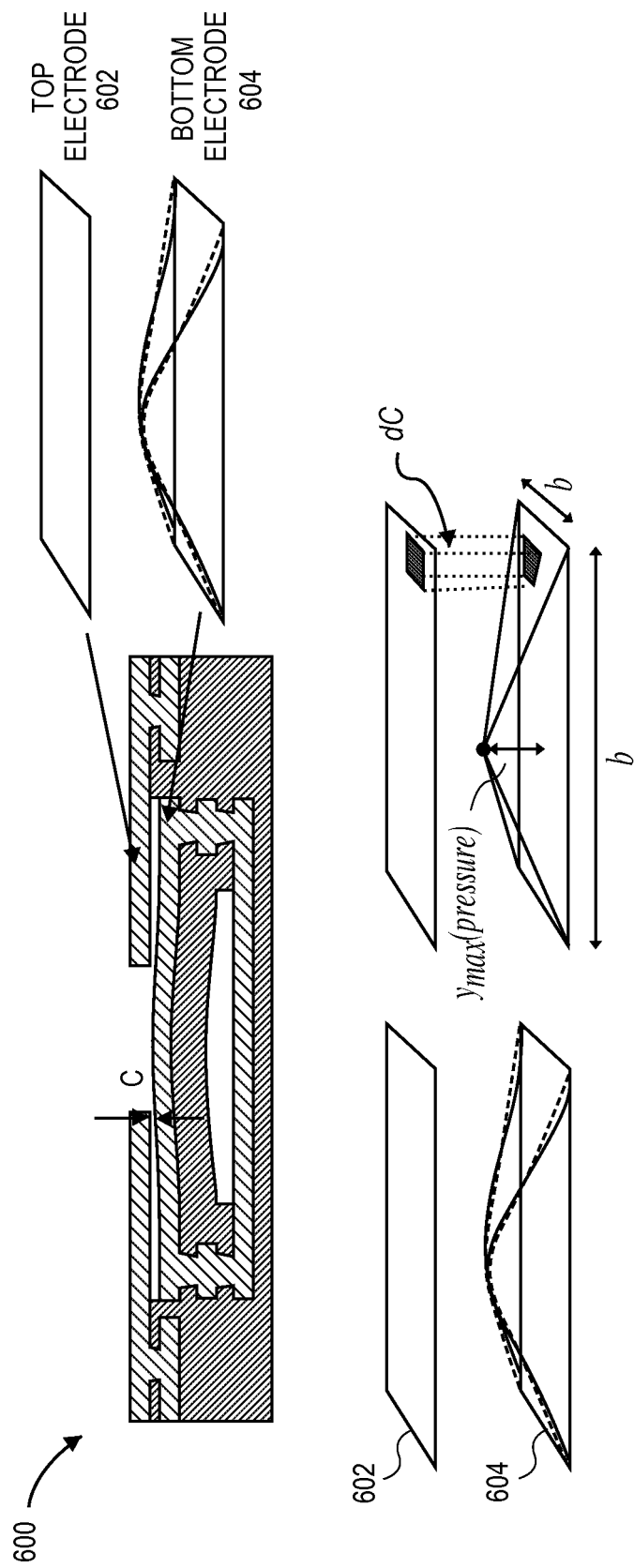

As described in association with FIGS. 4A-4C, a sensed capacitance may be based on diaphragm motion in an air pressure sensor. FIGS. 6A and 6B illustrate schematics and equations for determining analytical calculations for sensing air pressure in a capacitive manner, in accordance with an embodiment of the present invention. In particular, an analytical approach may be developed to model the sensitivity and range of the air pressure sensor. Referring to FIG. 6A, for such estimations, it is assumed that an air pressure sensor 600 includes a top electrode 602 that is rigid and a bottom electrode 604 that is flexible. A capacitance (C) is sensed between 602 and 604. The maximum diaphragm deformation is estimated, and the deformation shape of the diaphragm is approximated to be pyramidal. The total capacitance is the integral sum of each individual capacitance dC. Referring to FIG. 6B, square diaphragm deflection is determined by 606. Diaphragm deflection is approximated by a pyramidal surface. The capacitance dC is integrated along the length and width of the capacitor, via 608. The total capacitance 614 is then determined using 610 and 612.

Figure 7A:
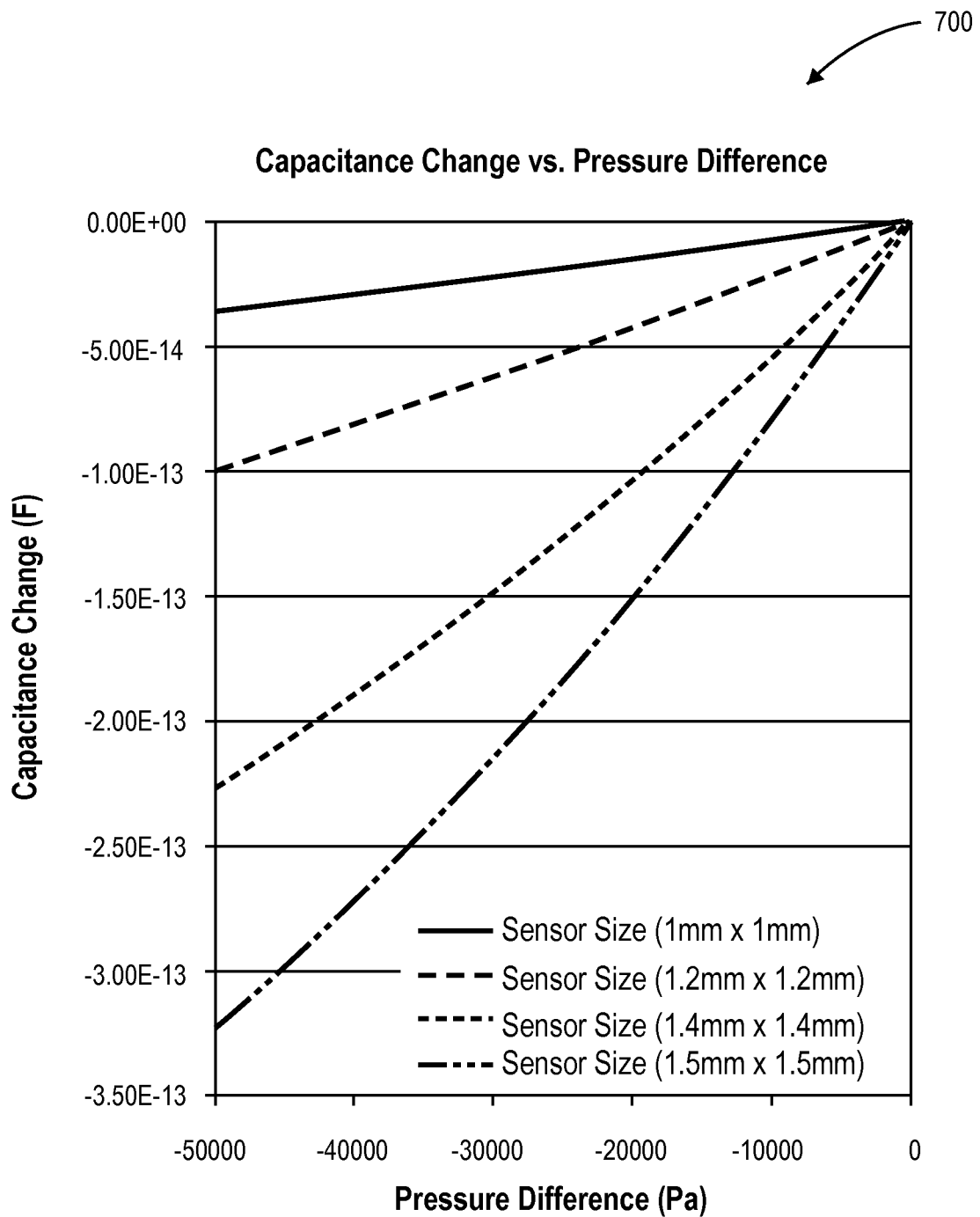
FIG. 7A is a plot of capacitance change versus negative pressure difference, in accordance with an embodiment of the present invention.
Figure 7B:
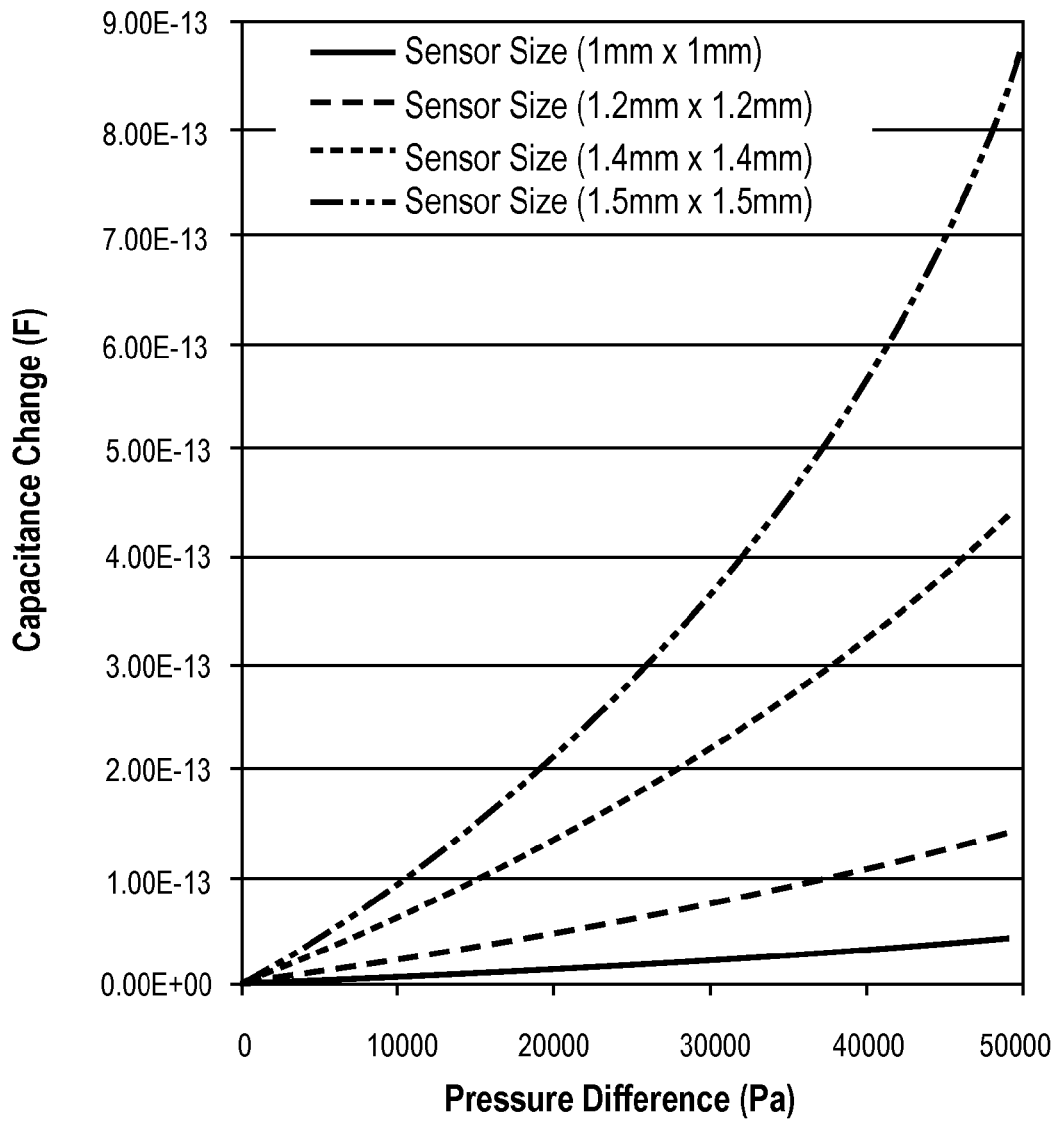
FIG. 7B is a plot of capacitance change versus positive pressure difference, in accordance with an embodiment of the present invention.

An estimated response for a capacitive air pressure sensor may thus be provided. As an example, FIG. 7A is a plot 700 of capacitance change versus negative pressure difference, while FIG. 7B is a plot 702 of capacitance change versus positive pressure difference, in accordance with an embodiment of the present invention. The estimated response curves for various sensor sizes using standard BBUL process conditions include tgap=10 um, t=15 um, b=1 mm, 1.2 mm, 1.4 mm, 1.5 mm. For mobile barometric pressure sensor applications, in an embodiment, the target range is approximately 0.5 atm to 1 atm (approximately 50 kPa to 100 kPa), with a minimum detectable sensitivity of 50 Pa to 100 Pa. In an embodiment, referring to FIGS. 7A and 7B, sufficient sensitivity and range is achieved with a 1.5 mm×1.5 mm diaphragm.

Figure 8:
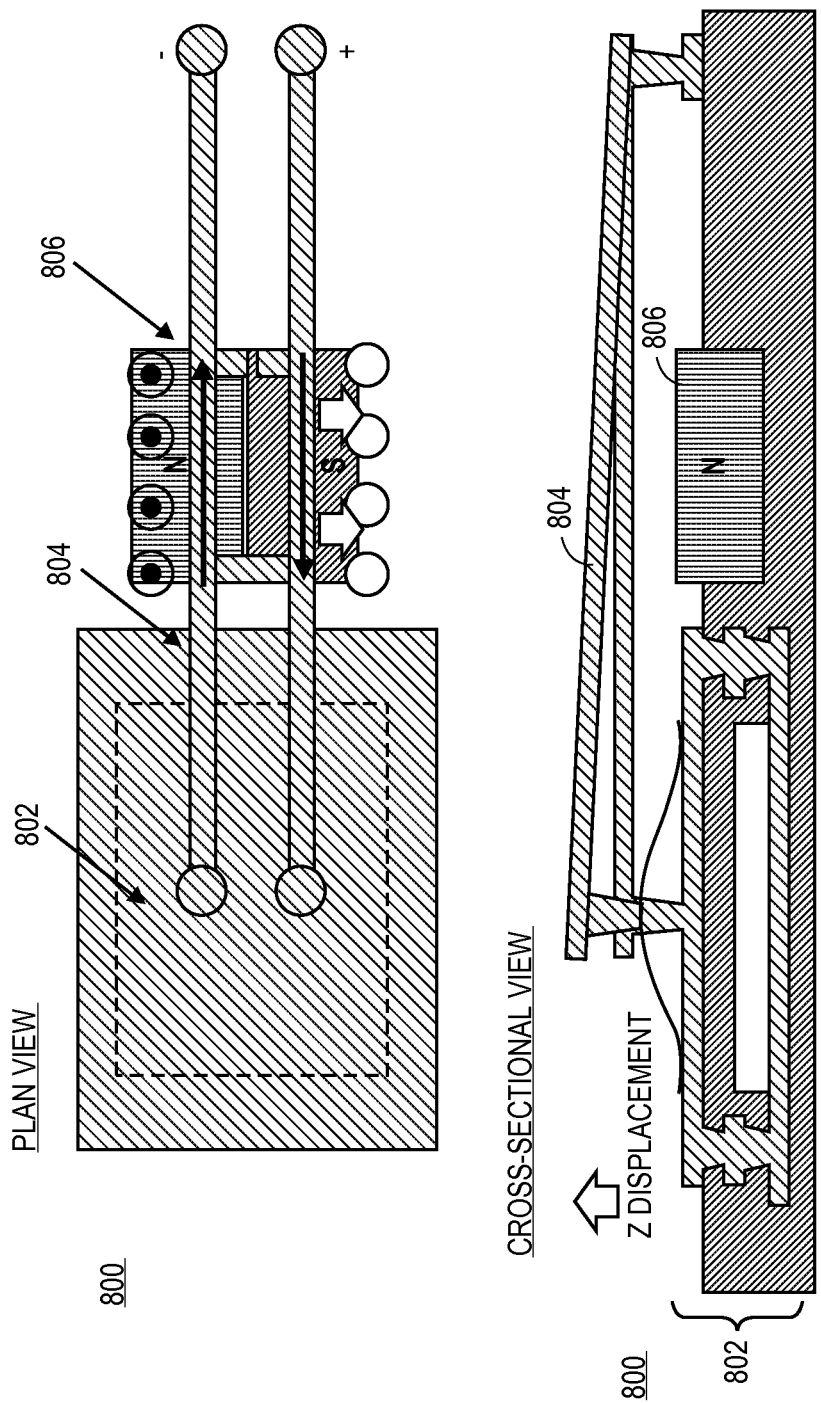
FIG. 8 illustrates a plan view and corresponding cross-sectional view of a magnetically-actuated resonant beam air pressure sensor, in accordance with an embodiment of the present invention.

A magnetically-actuated beam may be used in conjunction with an air pressure sensor described above. For example, FIG. 8 illustrates a plan view and corresponding cross-sectional view of a magnetically-actuated resonant beam air pressure sensor, in accordance with an embodiment of the present invention. Referring to FIG. 8, a magnetically-actuated resonant beam air pressure sensor 800 includes a diaphragm 802, resonant beams 804 and an embedded magnet 806. Resonant beams are actuated through interaction of an AC current with the permanent magnet. In the configuration depicted in FIG. 8, diaphragm deflection due to a difference in air pressure transduces a Z-displacement, which applies tension onto the resonant beam and increases the resonant frequency. In general, it is to be understood that structures may be more sensitive to changes in resonant frequency, and so may have a higher sensitivity in such a configuration.

FIG. 9 illustrates schematics and equations for determining analytical calculations for sensing air pressure for a magnetically-actuated resonant beam air pressure sensor, in accordance with an embodiment of the present invention. Referring to FIG. 9, as was the case for FIGS. 6A and 6B, the maximum diaphragm deflection is given by 902. Diaphragm deflection induces Z-change, which applies tension to the resonant beams, as depicted in 904. An analytical approach is used to model the sensitivity and range of the magnetically-actuated air pressure sensor. It is assumed that the change in diaphragm height contributes to a change in beam length which translates into beam tension and an increased beam resonant frequency. In the analysis of FIG. 9, using equations 906, 908, 910, 912 and 914, the beam is assumed to be resonating in the y-direction, though in principle, any resonant mode may be used.

Figure 10A:
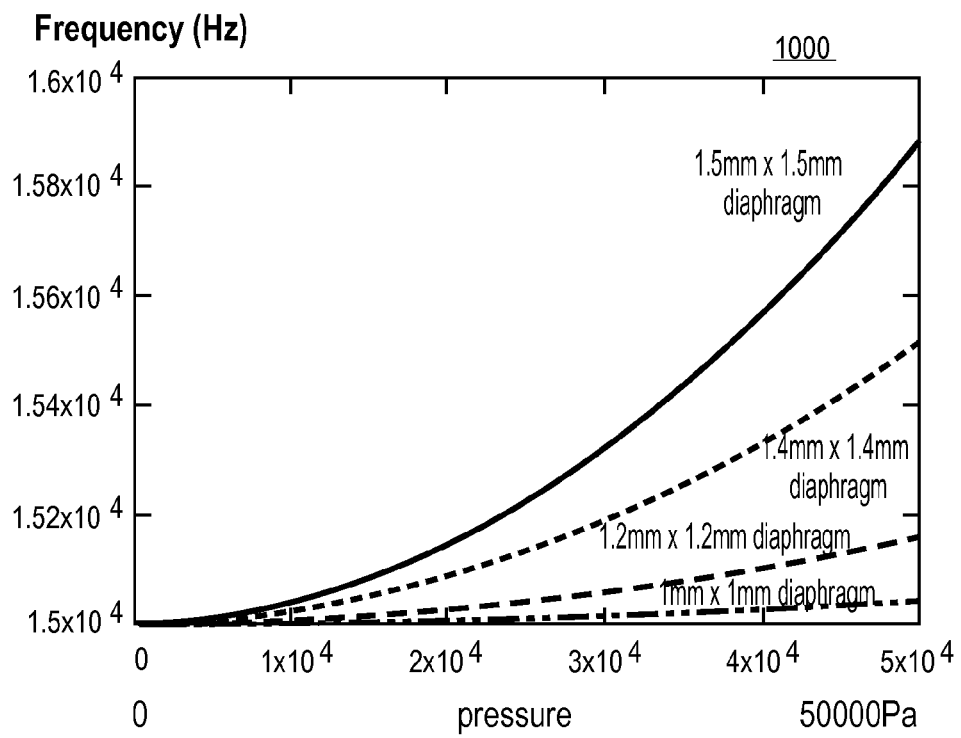
FIG. 10A is a plot of estimated response frequency for a magnetically actuated air pressure sensor, in accordance with an embodiment of the present invention.
Figure 10B:
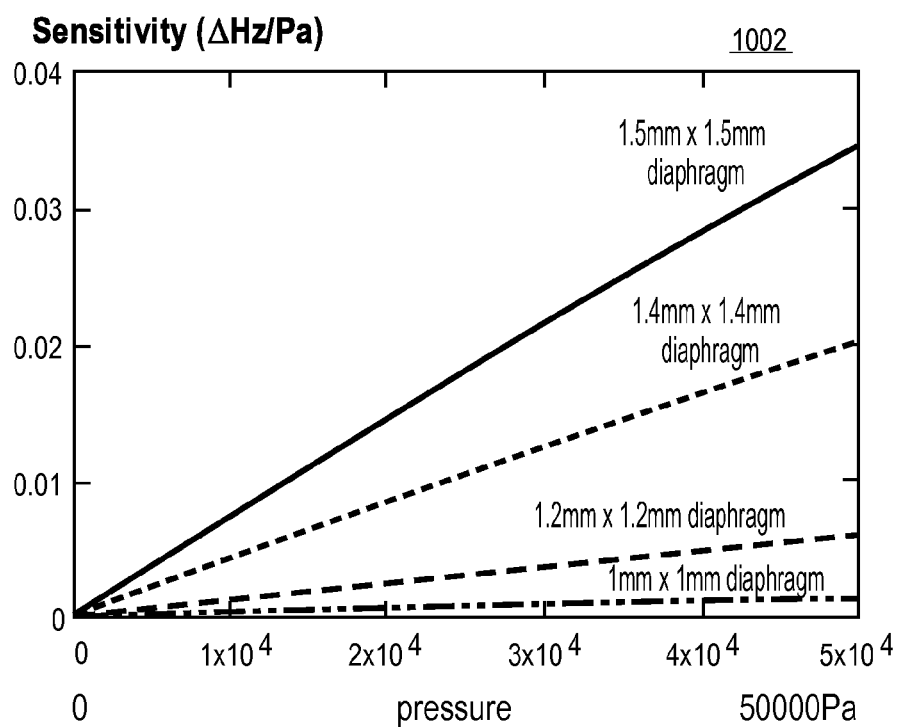
FIG. 10B is a plot of estimated response sensitivity, for a magnetically actuated air pressure sensor, in accordance with an embodiment of the present invention.

A response may be estimated for a magnetically actuated air pressure sensor. For example, FIG. 10A is a plot 1000 of estimated response frequency (Hz), while FIG. 10B is a plot 1002 of estimated response sensitivity (AHz/Pa), for a magnetically actuated air pressure sensor, in accordance with an embodiment of the present invention. Referring to FIGS. 10A and 10B, estimated response curves are for various sensor sizes using standard BBUL process conditions, e.g., tgap=10 um, t=15 um, b=1 mm, 1.2 mm, 1.4 mm, 1.5 mm. For mobile barometric pressure sensor applications, in an embodiment, the target range is approximately 0.5 atm to 1 atm (approximately 50 kPa to 100 kPa), with a minimum detectable sensitivity of 50 Pa to 100 Pa. Beam length is 1000 um, and beam resonant frequency is approximately 15000 Hz. With a 1.5 mm×1.5 mm diaphragm, in an embodiment, a change in 50 Pa translates into a frequency change of more than 1 Hz, which is sufficient sensitivity for certain applications.

A packaged MEMS device, such as an air pressure sensor, may be housed in a variety of packaging options. In a first example, FIGS. 11A-11P illustrate cross-sectional views of various operations in a process flow using copper mesh support for lamination of ABF above a reference cavity, in accordance with an embodiment of the present invention.

Figure 11A:
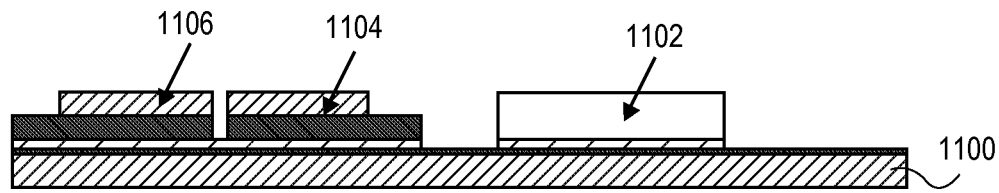
FIGS. 11A-11P illustrate cross-sectional views of various operations in a process flow using copper mesh support for lamination of ABF above a reference cavity, in accordance with an embodiment of the present invention.
Figure 11B:
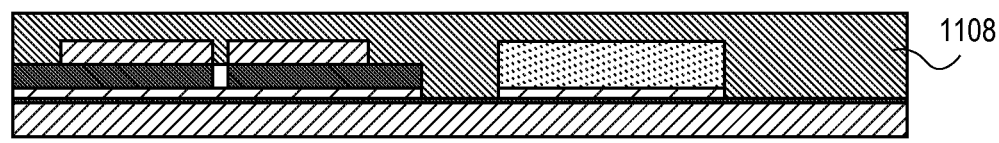
Figure 11C:
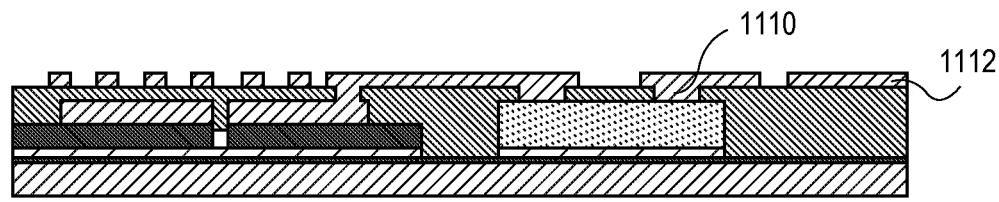
Figure 11D:
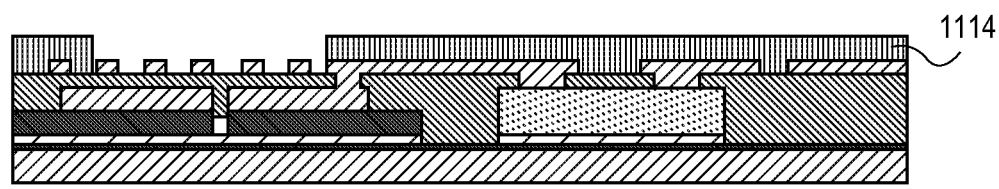
Figure 11E:
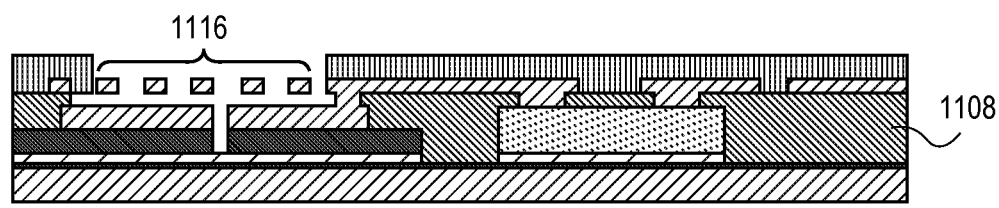
Figure 11F:
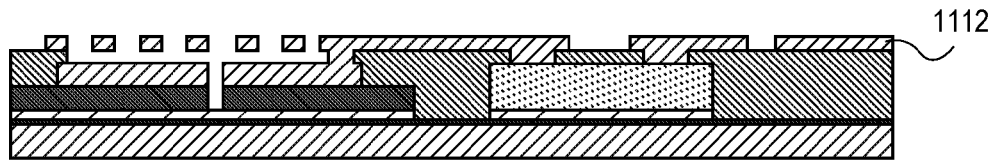
Figure 11G:
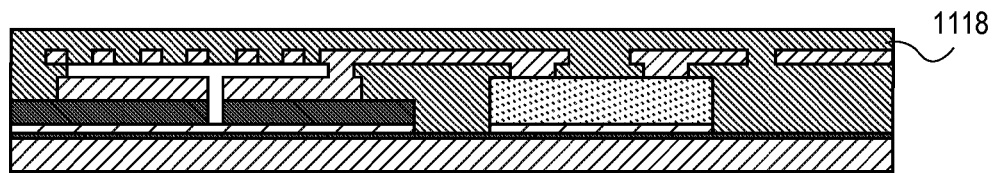
Figure 11H:
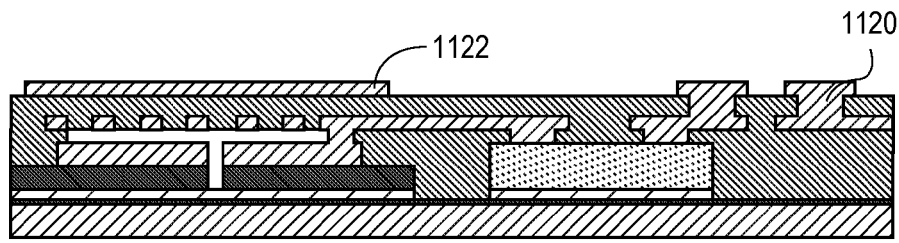
Figure 11I:
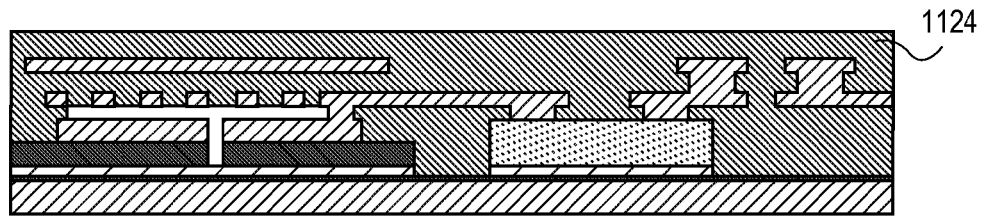
Figure 11J:
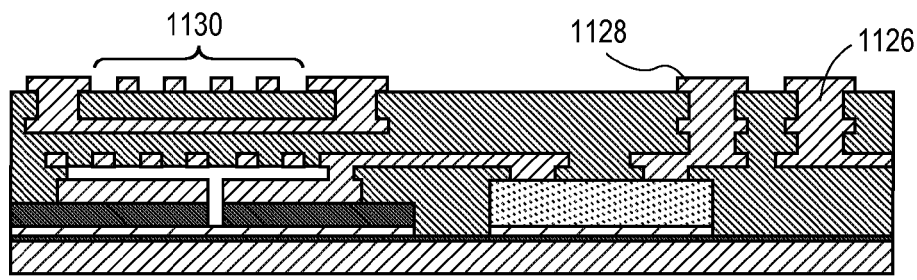
Figure 11K:
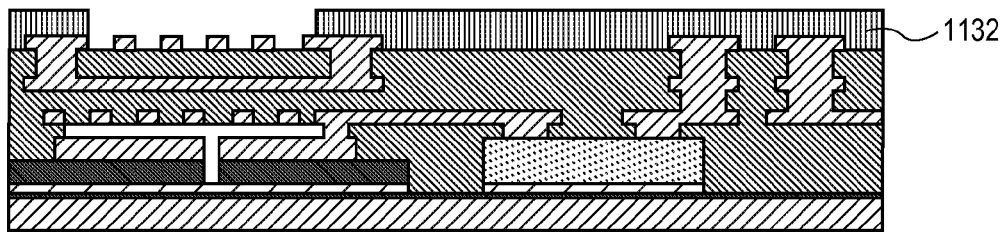
Figure 11L:
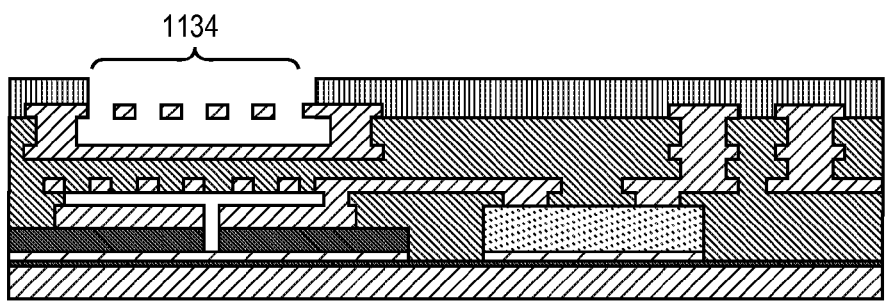
Figure 11M:
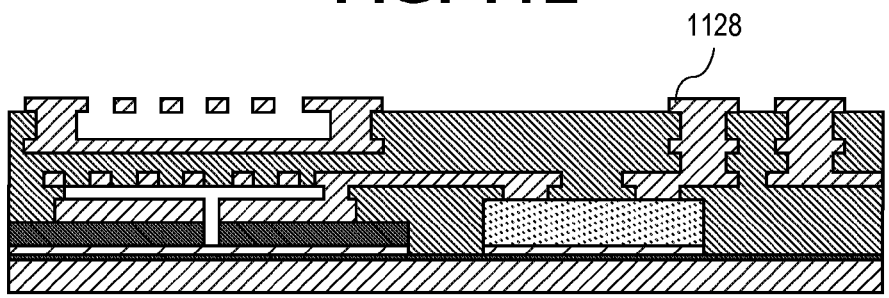
Figure 11N:
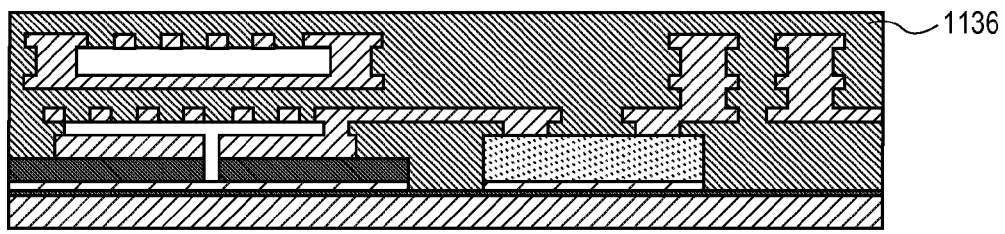
Figure 11O:
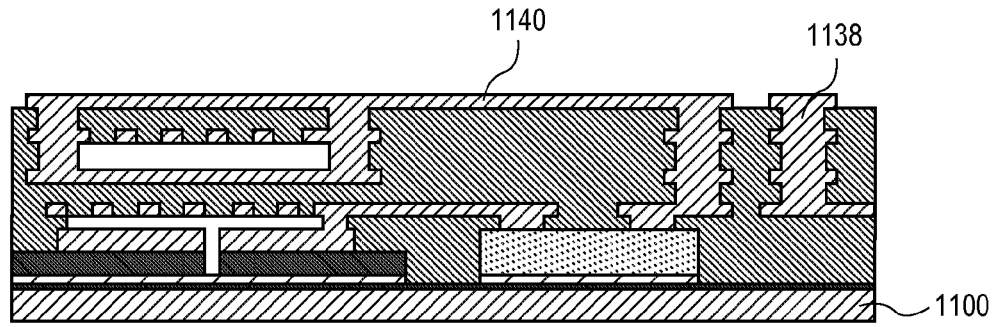
Figure 11P:
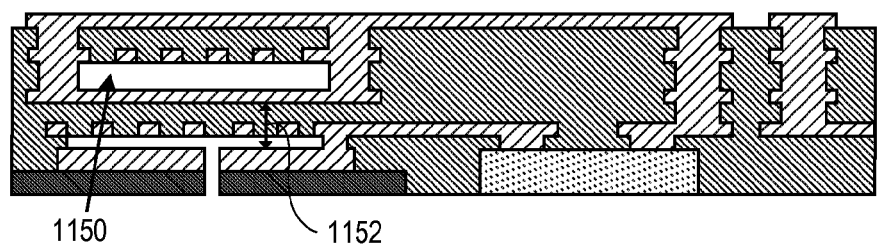

Referring to FIG. 11A, a die 1102 (which may include an amplifier, etc.) is placed on a thin substrate 1104 (e.g., silicon, etc.) adjacent an electrode 1106 (e.g., a copper electrode), above a metal holder 1100 (e.g., a copper holder). A laminate organic dielectric film 1108 is disposed above the structure of FIG. 11A, as depicted in FIG. 11B. Referring to FIG. 11C, via hole drilling and electroplating is performed to provide vias 1110 and copper layer 1112 (again, a suitable metal other than copper may be used wherever copper is referred to herein). A photoresist layer 1114 is then formed and patterned to protect sensitive areas, as depicted in FIG. 11D. Referring to FIG. 11E, oxygen plasma release is then performed to remove a portion of organic dielectric film 1108 and to release structure 1116. Resist stripping is then performed to re-expose layer 1112, as depicted in FIG. 11F. Referring to FIG. 11G, lamination of an organic dielectric film 1118 is then performed. Via drilling and electroplating is then performed to provide vias 1120 and copper layer 1122, as depicted in FIG. 11H. Referring to FIG. 11I, organic dielectric film 1124 is then laminated on the structure of FIG. 11H. Via drilling and electroplating is again performed to provide vias 1126 and copper layer 1128, as depicted in FIG. 11J. Additionally, a copper mesh structure 1130 is electroplated for lamination support. Referring to FIG. 11K, photoresist layer 1132 is formed and patterned to protect sensitive areas. An oxygen plasma release is the performed to release structure 1134, as depicted in FIG. 11L. Referring to FIG. 11M, photoresist layer 1132 is then stripped, re-exposing layer 1128. Lamination of another insulator layer 1136 is then performed above the structure of FIG. 11M, as depicted in FIG. 11N. Referring to FIG. 11O, via drilling and electroplating is performed to provide vias 1138 and copper layer 1140. The copper holder 1100 is then removed, as depicted in FIG. 11P. A reference cavity 1150 and capacitor 1152 is thus formed.

Referring again to FIG. 11P, the structure as depicted can be viewed as a completed package for the semiconductor die included therein. However, for specific implementations, an array of external contacts (e.g., BGA contacts) may optionally be formed above or below the structure depicted in FIG. 11P. The resulting structure may then be coupled to a printed circuit board (PCB) or like receiving surface.

Figure 12A:
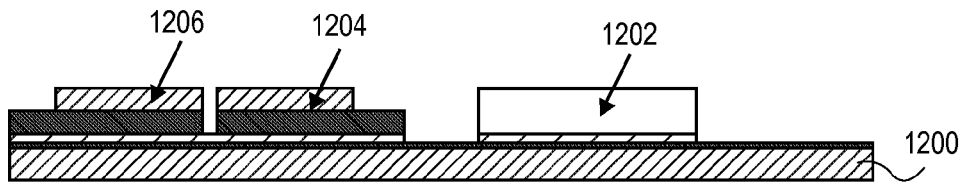
FIGS. 12A-12Q illustrate cross-sectional views of various operations in a process flow using a thin plate to support lamination of ABF above a reference cavity, in accordance with an embodiment of the present invention.
Figure 12B:
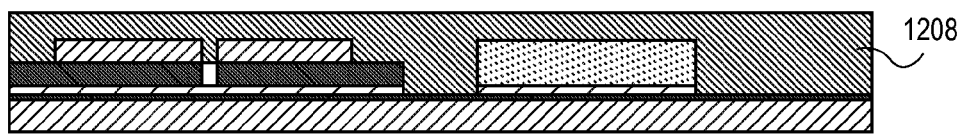
Figure 12C:
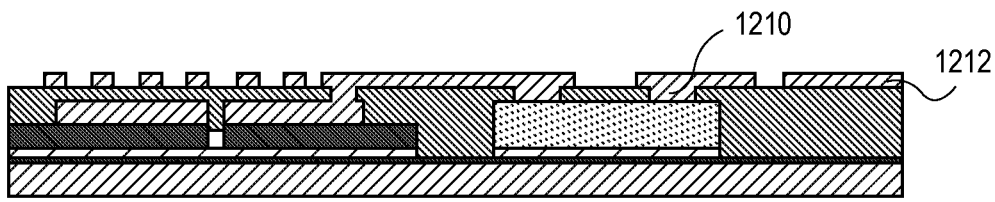
Figure 12D:
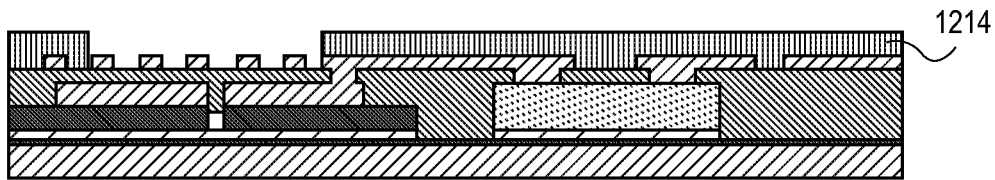
Figure 12E:
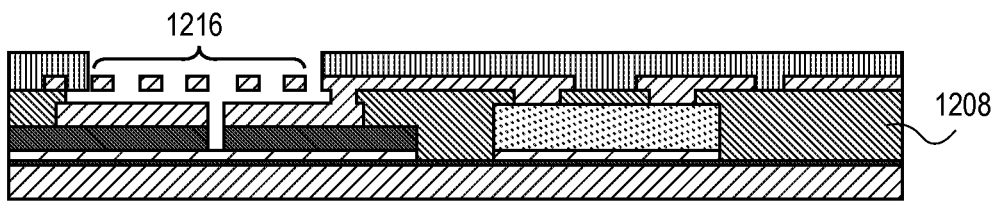
Figure 12F:
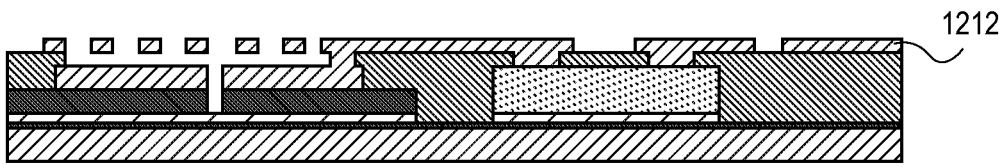
Figure 12G:
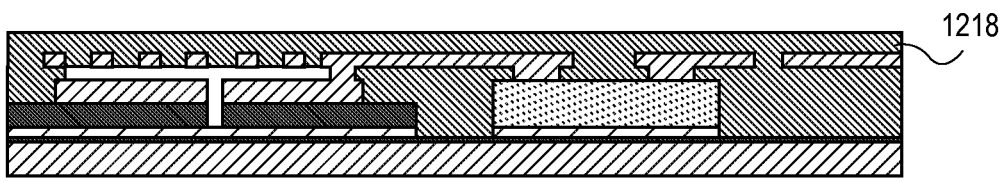
Figure 12H:
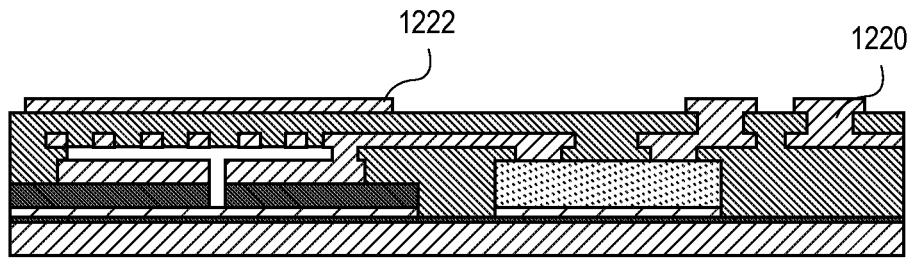
Figure 12I:
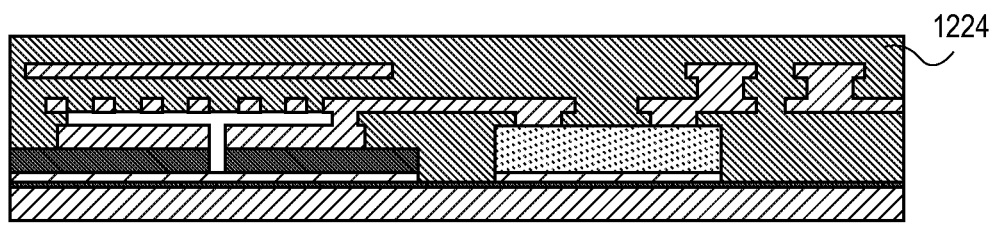
Figure 12J:
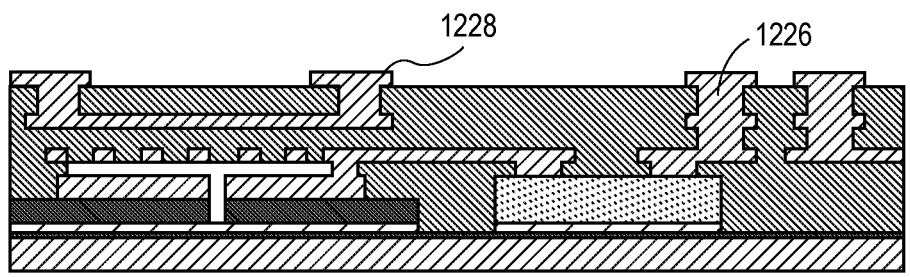
Figure 12K:
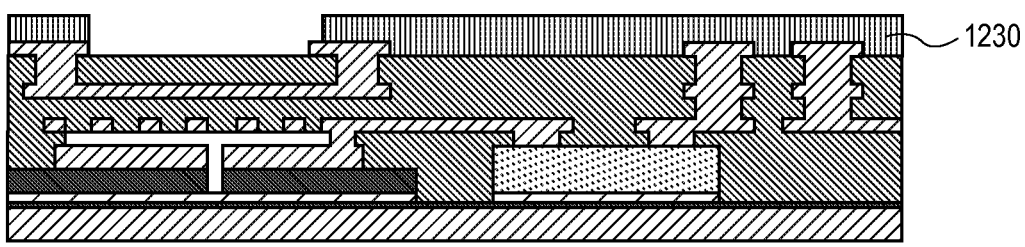
Figure 12L:
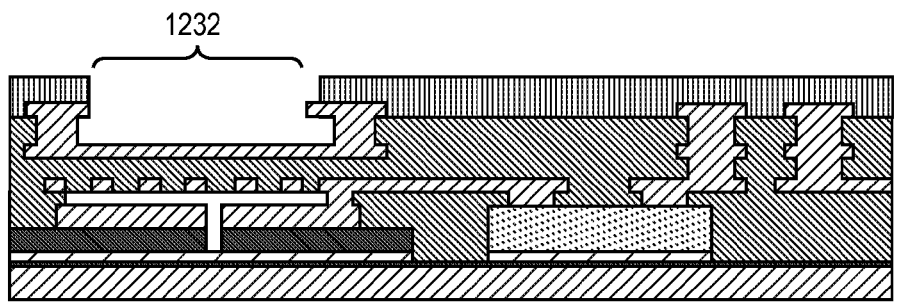
Figure 12M:
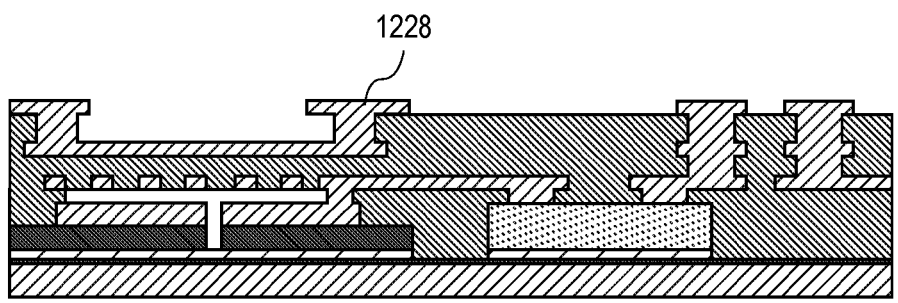
Figure 12N:
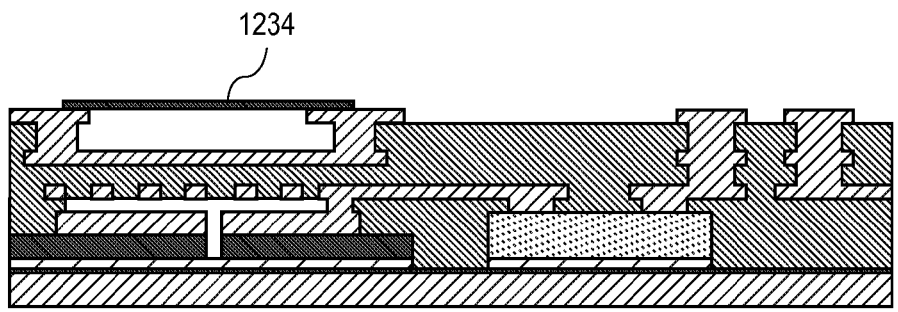
Figure 12O:
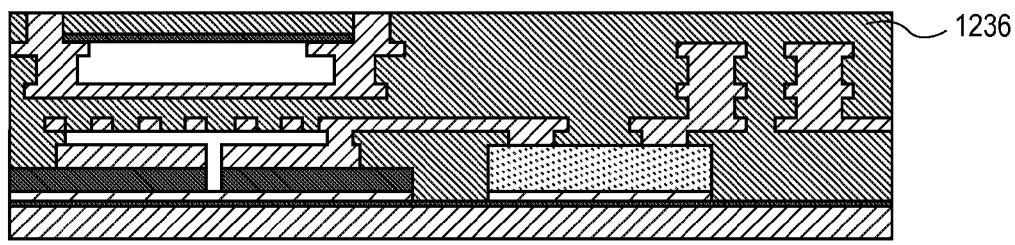
Figure 12P:
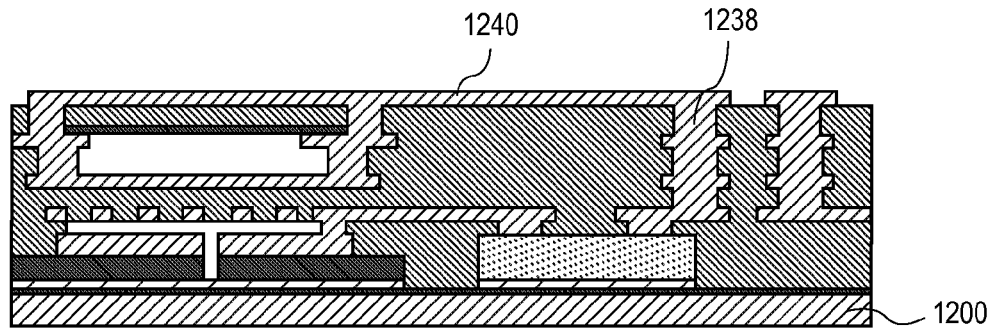
Figure 12Q:
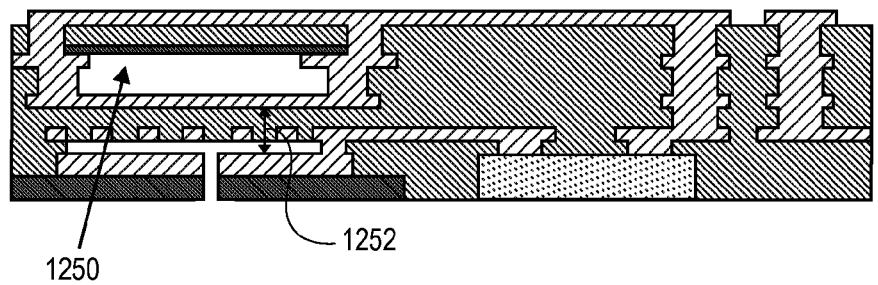

In a second example, FIGS. 12A-12Q illustrate cross-sectional views of various operations in a process flow using a thin plate to support lamination of ABF above a reference cavity, in accordance with an embodiment of the present invention.

Referring to FIG. 12A, a die 1202 (which may include an amplifier, etc.) is placed on a thin substrate 1204 (e.g., silicon, etc.) adjacent an electrode 1206 (e.g., a copper electrode), above a metal holder 1200 (e.g., a copper holder). A laminate organic dielectric film 1208 is disposed above the structure of FIG. 12A, as depicted in FIG. 12B. Referring to FIG. 12C, via hole drilling and electroplating is performed to provide vias 1210 and copper layer 1212. A photoresist layer 1214 is then formed and patterned to protect sensitive areas, as depicted in FIG. 12D. Referring to FIG. 12E, oxygen plasma release is then performed to remove a portion of organic dielectric film 1208 and to release structure 1216. Resist stripping is then performed to re-expose layer 1212, as depicted in FIG. 12F. Referring to FIG. 12G, lamination of an organic dielectric film 1218 is then performed. Via drilling and electroplating is then performed to provide vias 1220 and copper layer 1222, as depicted in FIG. 12H. Referring to FIG. 12I, organic dielectric film 1224 (e.g., ABF) is then laminated on the structure of FIG. 12H. Via drilling and electroplating is again performed to provide vias 1226 and copper layer 1228, as depicted in FIG. 12J. Referring to FIG. 12K, photoresist layer 1230 is formed and patterned to protect sensitive areas. An oxygen plasma release is the performed to release structure 1232, as depicted in FIG. 12L. Referring to FIG. 12M, photoresist layer 1230 is then stripped, re-exposing layer 1228. A pick and place approach is then performed to provide a thin plate 1234, as depicted in FIG. 12N. Referring to FIG. 12O, lamination of another insulator layer 1236 is then performed above the structure of FIG. 12N. Via drilling and electroplating is performed to provide vias 1238 and copper layer 1240, as depicted in FIG. 12P. Referring to FIG. 12Q, the copper holder 1200 is then removed. A reference cavity 1250 and capacitor 1252 is thus formed.

Referring again to FIG. 12Q, the structure as depicted can be viewed as a completed package for the semiconductor die included therein. However, for specific implementations, an array of external contacts (e.g., BGA contacts) may optionally be formed above or below the structure depicted in FIG. 12Q. The resulting structure may then be coupled to a printed circuit board (PCB) or like receiving surface.

Figure 13A:
FIGS. 13A-13T illustrate cross-sectional views of various operations in a process flow for fabricating a magnetically actuated pressure sensor, in accordance with an embodiment of the present invention.
Figure 13B:
Figure 13C:
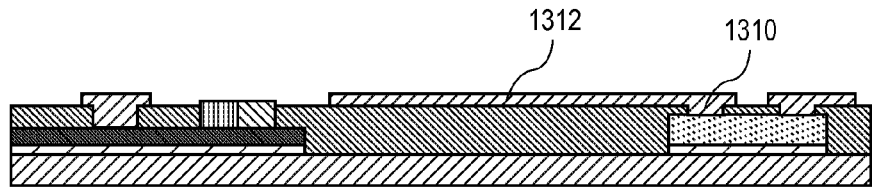
Figure 13D:
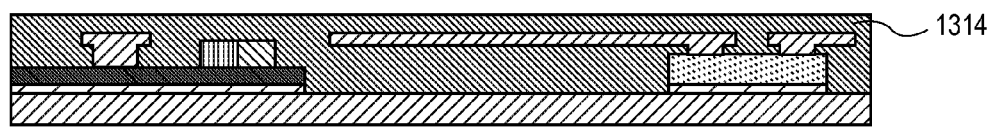
Figure 13E:
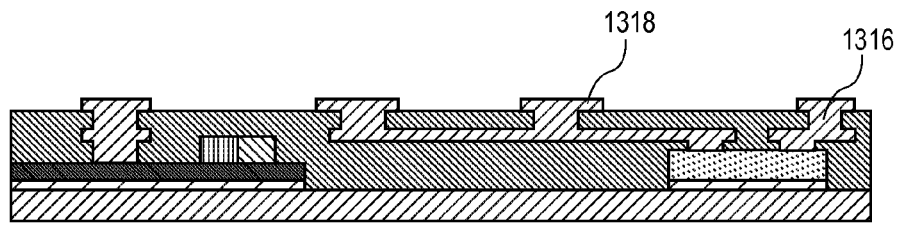
Figure 13F:
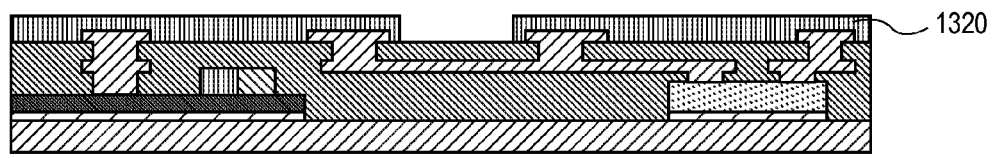
Figure 13G:
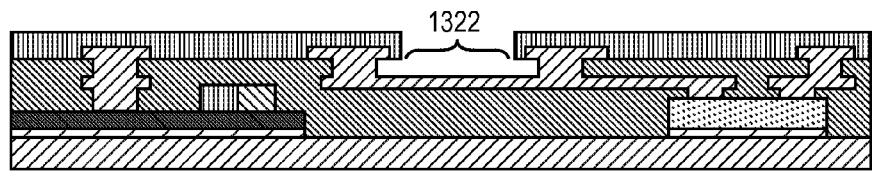
Figure 13H:
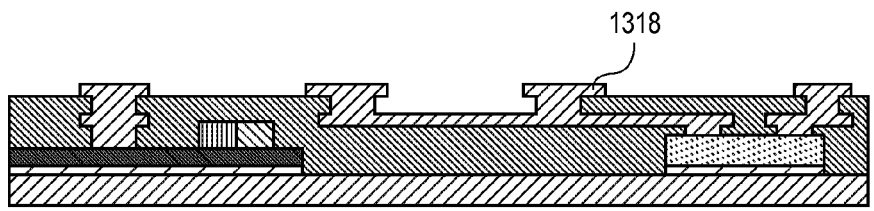
Figure 13I:
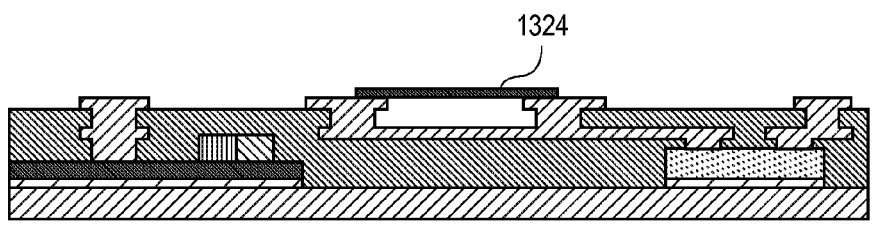
Figure 13J:
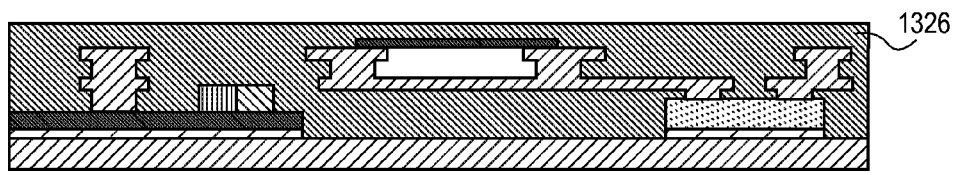
Figure 13K:
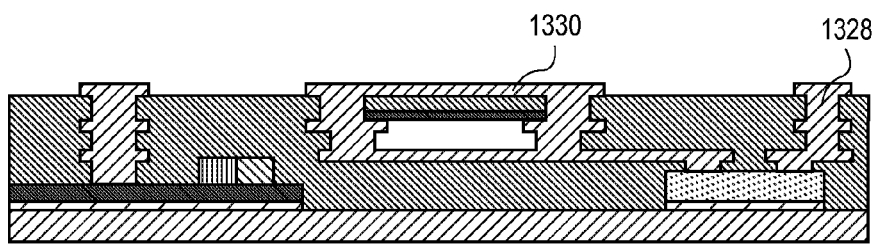
Figure 13L:
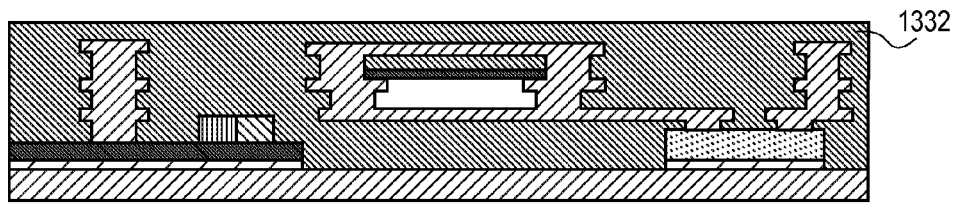
Figure 13M:
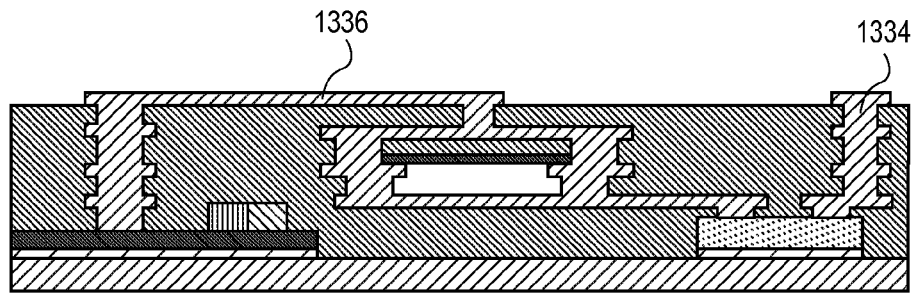
Figure 13N:
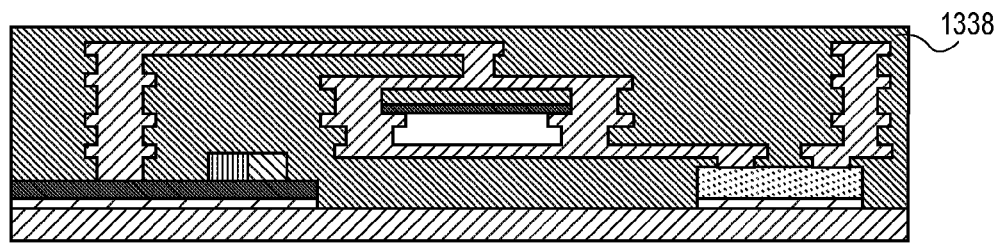
Figure 13O:
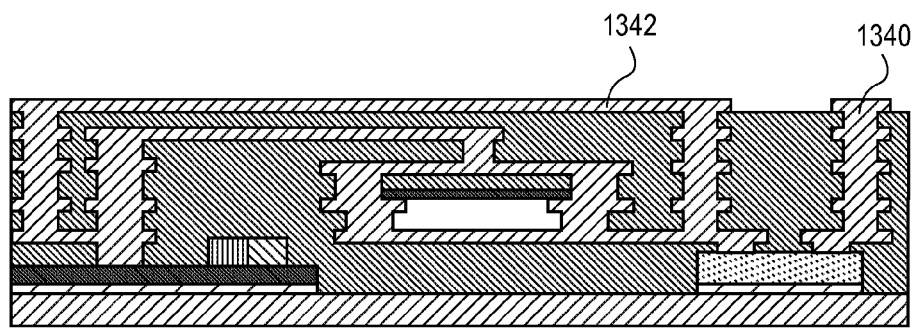
Figure 13P:
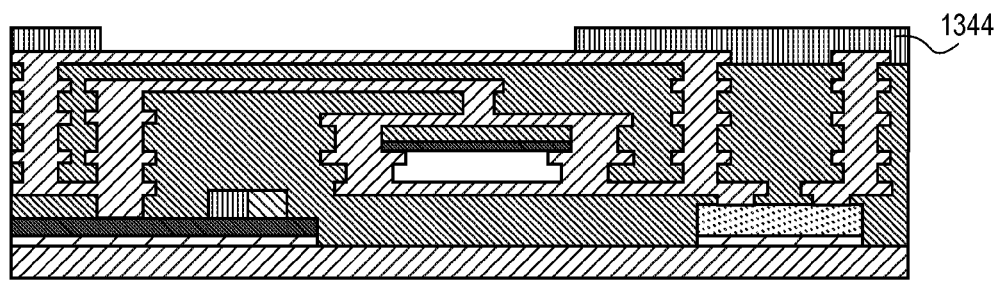
Figure 13Q:
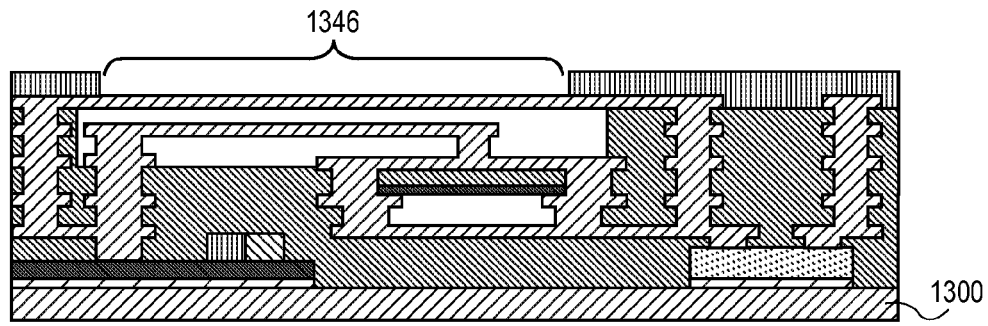
Figure 13R:
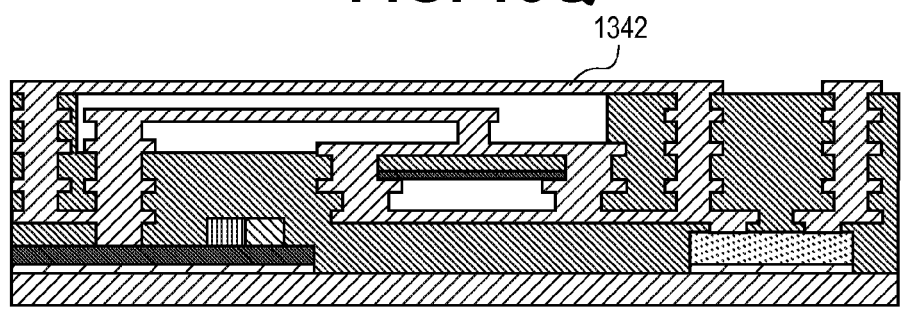
Figure 13S:
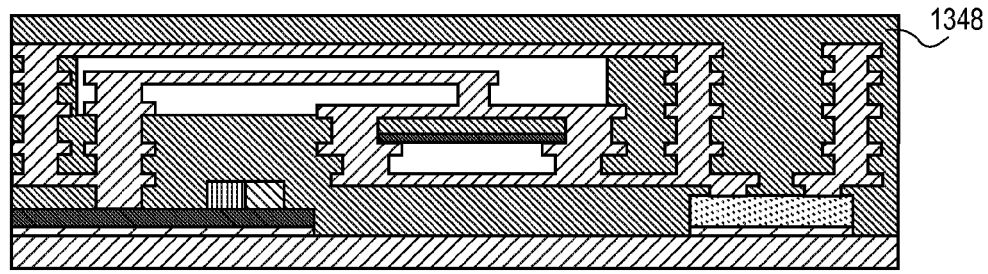
Figure 13T:
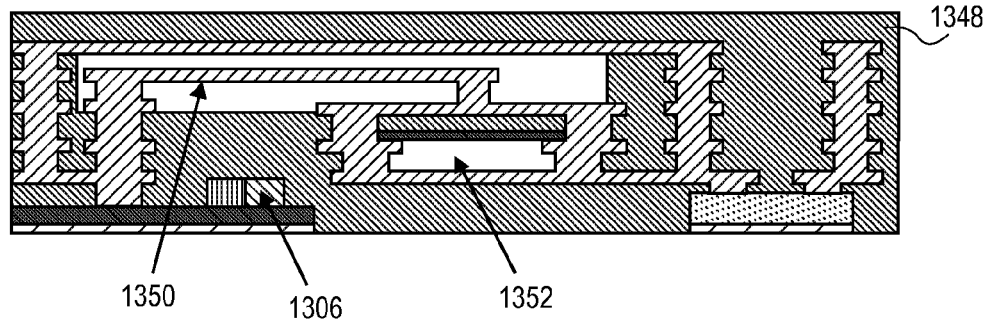

In a third example, FIGS. 13A-13T illustrate cross-sectional views of various operations in a process flow for fabricating a magnetically actuated pressure sensor, in accordance with an embodiment of the present invention.

Referring to FIG. 13A, a die 1302 (which may include an amplifier, etc.) is placed on a thin substrate 1304 (e.g., silicon, etc.) adjacent a magnet 1306, above a metal holder 1300 (e.g., a copper holder). A laminate organic dielectric film 1308 is disposed above the structure of FIG. 13A, as depicted in FIG. 13B. Referring to FIG. 13C, via hole drilling and electroplating is performed to provide vias 1310 and copper layer 1312. A laminate organic dielectric film 1314 is then disposed above the structure of FIG. 13C, as depicted in FIG. 13D. Referring to FIG. 13E, via hole drilling and electroplating is performed to provide vias 1316 and copper layer 1318. A photoresist layer 1320 is then formed and patterned to protect sensitive areas, as depicted in FIG. 13F. Referring to FIG.

13G, oxygen plasma release is then performed to remove a portion of organic dielectric film 1314 and to release structure 1322. Resist stripping is then performed to re-expose layer 1318, as depicted in FIG. 13H. Referring to FIG. 13I, a thin metal plate 1324 may be optionally provided for support or, alternatively, a mesh structure may be formed. Referring to FIG. 13J, lamination of an organic dielectric film 1326 is then performed. Via drilling and electroplating is then performed to provide vias 1328 and copper layer 1330, as depicted in FIG. 13K. Referring to FIG. 13L, organic dielectric film 1332 (e.g., ABF) is then laminated on the structure of FIG. 13K. Via drilling and electroplating is again performed to provide vias 1334 and copper layer 1336, as depicted in FIG. 13M. Additionally (although not shown) a trace layer including resonant beam coils may be formed during this process operation. Referring to FIG. 13N, organic dielectric film 1338 is then laminated on the structure of FIG. 13M. Via drilling and electroplating is again performed to provide vias 1340 and copper layer 1342, as depicted in FIG. 13O. This operation may be used if, e.g., support meshing is to be formed. In such a case, plate protection mesh is formed as an optional structural support and is anchored at many locations not occupied by MEMS structure. Referring to FIG. 13P, photoresist layer 1344 is formed and patterned to protect sensitive areas. An oxygen plasma release is then performed to release structure 1346, as depicted in FIG. 13Q. Referring to FIG. 13R, photoresist layer 1344 is then stripped, re-exposing layer 1342. Referring to FIG. 13S, lamination of another insulator layer 1348 is then performed above the structure of FIG. 13R. The copper holder 1300 is then removed, as depicted in FIG. 13T. A reference cavity 1350 and capacitor 1352 is thus formed, along with the embedded magnet 1306.

Referring again to FIG. 13T, the structure as depicted can be viewed as a completed package for the semiconductor die included therein. However, for specific implementations, an array of external contacts (e.g., BGA contacts) may optionally be formed above or below the structure depicted in FIG. 13T. The resulting structure may then be coupled to a printed circuit board (PCB) or like receiving surface.

With reference to FIGS. 11A-11P, 12A-12Q and 13A-13T, an air pressure sensor may be fabricated in BBUL layers. The BBUL layer may be part of a larger BBUL system. In general, BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers.

An air pressure sensor may be formed in BBUL layers during packaging of a semiconductor die on a panel of a carrier. The carrier may be provided having planar panels or panels with a plurality of cavities disposed therein, each sized to receive a semiconductor die. During processing, identical structures may be mated in order to build a back-to-back apparatus for processing utility. Consequently, processing throughput is effectively doubled. For example, a carrier may include panels with 1000 recesses on either side, allowing for fabrication of 2000 individual packages from a single carrier. The panel may include an adhesion release layer and an adhesive binder. A cutting zone may be provided at each end of the apparatus for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses.

Regarding the overall packaging process described in association with FIGS. 11A-11P, 12A-12Q and 13A-13T, in an embodiment, the substrate formed is a coreless substrate since a panel is used to support the packaging of a semiconductor die through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

In an embodiment, an active surface of the packaged semiconductor die includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in a coreless substrate.

The packaged semiconductor die may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

As mentioned briefly above, an array of external conductive contacts may subsequently be formed. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

In an embodiment, as described above, the substrate is a BBUL substrate. In one such embodiment, an air pressure sensor is embedded within the buildup layers along with a semiconductor die. Although described in detail above for a BBUL process, other process flows may be used instead. For example, in another embodiment, a semiconductor die is housed in a core of a substrate. In another embodiment, fan-out layers are used.

The term "MEMS" generally refers to an apparatus incorporating some mechanical structure having a dimensional scale that is comparable to microelectronic devices. The mechanical structure is typically capable of some form of mechanical motion and having dimensions below approximately 250 microns; however, some embodiments may include MEMS sensors that are a few millimeters across a package. Thus, MEMS structures contemplated herein are, in an embodiment, any device that falls within the scope of MEMS technologies. For example, a MEMS structure may be any mechanical and electronic structure having a critical dimension of less than approximately 250 microns and fabricated using lithography, deposition, and etching processes above a substrate. In accordance with an embodiment of the present invention, the MEMS structure is a device such as, but not limited to, a resonator, a sensor, a detector, a filter or a mirror. In one embodiment, the MEMS structure is a resonator. In a specific embodiment, the resonator is one such as, but not limited to, a beam, a plate and a tuning fork or a cantilever arm. In an embodiment, an electroplated copper layer is used to form a hermetic seal for a reference air pressure cavity for a MEMS based air pressure sensor.

Embodiments of the present invention may be suitable for fabricating a system on a chip (SOC), e.g., for a smartphone or a tablet. In an embodiment, an air pressure sensor is integrated and fabricated in a BBUL packaging fab. The same backend processing used for existing BBUL coreless packaging may be used as a base flow. Alternatively, the process flow for die integration with MEMS may be applicable to other packaging substrate technologies.

Figure 14:
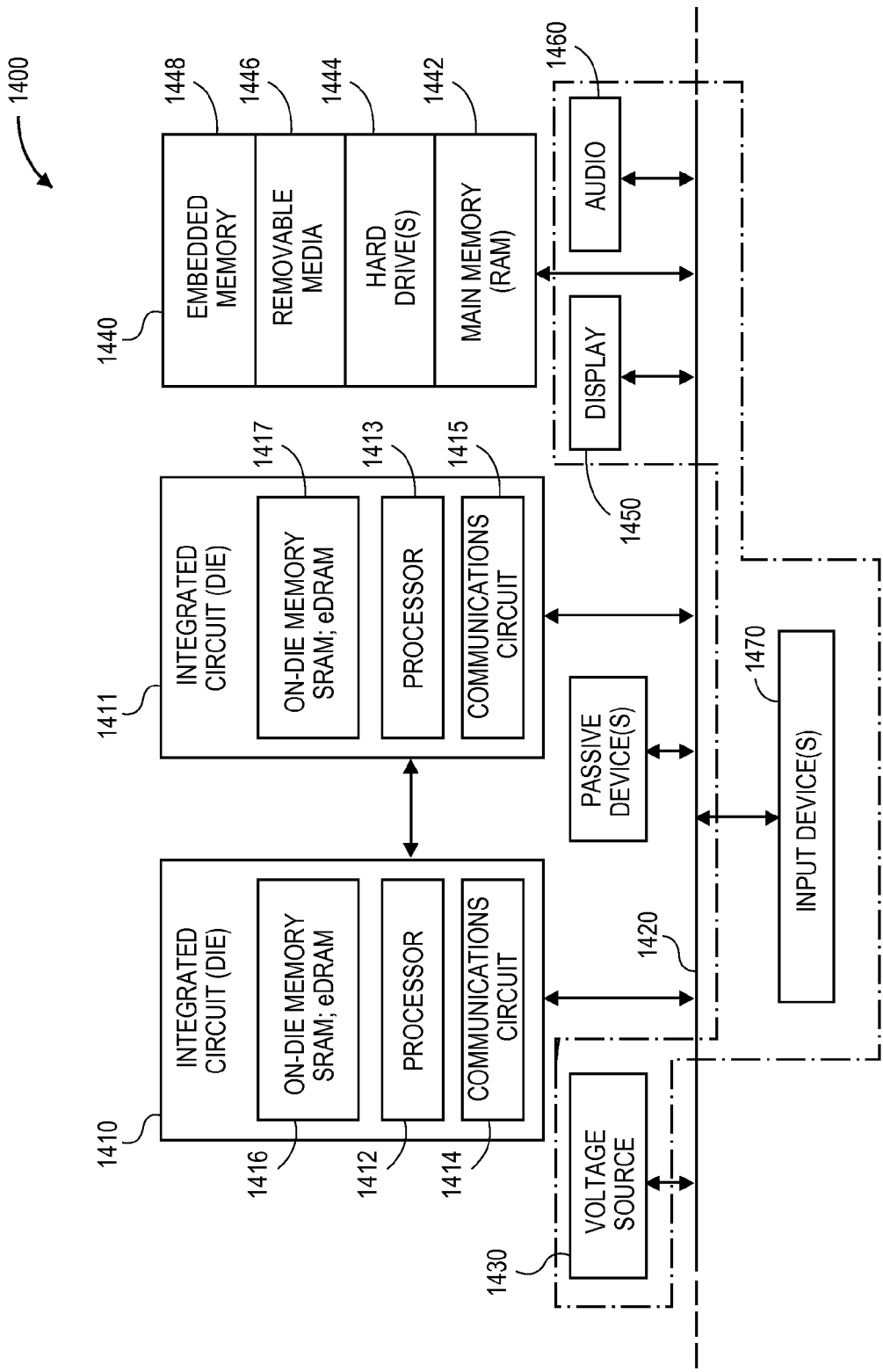
FIG. 14 is a schematic of a computer system, in accordance with an embodiment of the present invention.

FIG. 14 is a schematic of a computer system 1400, in accordance with an embodiment of the present invention. The computer system 1400 (also referred to as the electronic system 1400) as depicted can embody a semiconductor package having an air pressure sensor according to any of the several disclosed embodiments and their equivalents as set forth in this disclosure. The computer system 1400 may be a mobile device such as a netbook computer. The computer system 1400 may be a mobile device such as a wireless smart phone. The computer system 1400 may be a desktop computer. The computer system 1400 may be a hand-held reader. The computer system 1400 may be a watch.

In an embodiment, the electronic system 1400 is a computer system that includes a system bus 1420 to electrically couple the various components of the electronic system 1400. The system bus 1420 is a single bus or any combination of busses according to various embodiments. The electronic system 1400 includes a voltage source 1430 that provides power to the integrated circuit 1410. In some embodiments, the voltage source 1430 supplies current to the integrated circuit 1410 through the system bus 1420.

The integrated circuit 1410 is electrically coupled to the system bus 1420 and includes any circuit, or combination of circuits according to an embodiment. In an embodiment, the integrated circuit 1410 includes a processor 1412 that can be of any type. As used herein, the processor 1412 may mean any type of circuit such as, but not limited to, a microprocessor, a microcontroller, a graphics processor, a digital signal processor, or another processor. In an embodiment, the processor 1412 includes or is included in a semiconductor package having an air pressure sensor, as disclosed herein. In an embodiment, SRAM embodiments are found in memory caches of the processor. Other types of circuits that can be included in the integrated circuit 1410 are a custom circuit or an application-specific integrated circuit (ASIC), such as a communications circuit 1414 for use in wireless devices such as cellular telephones, smart phones, pagers, portable computers, two-way radios, and similar electronic systems. In an embodiment, the processor 1410 includes on-die memory 1416 such as static random-access memory (SRAM). In an embodiment, the processor 1410 includes embedded on-die memory 1416 such as embedded dynamic random-access memory (eDRAM).

In an embodiment, the integrated circuit 1410 is complemented with a subsequent integrated circuit 1411. Useful embodiments include a dual processor 1413 and a dual communications circuit 1415 and dual on-die memory 1417 such as SRAM. In an embodiment, the dual integrated circuit 1410 includes embedded on-die memory 1417 such as eDRAM.

In an embodiment, the electronic system 1400 also includes an external memory 1440 that in turn may include one or more memory elements suitable to the particular application, such as a main memory 1442 in the form of RAM, one or more hard drives 1444, and/or one or more drives that handle removable media 1446, such as diskettes, compact disks (CDs), digital variable disks (DVDs), flash memory drives, and other removable media known in the art. The external memory 1440 may also be embedded memory 1448 such as the first die in an embedded TSV die stack, according to an embodiment.

In an embodiment, the electronic system 1400 also includes a display device 1450 and an audio output 1460. In an embodiment, the electronic system 1400 includes an input device such as a controller 1470 that may be a keyboard, mouse, trackball, game controller, microphone, voice-recognition device, or any other input device that inputs information into the electronic system 1400. In an embodiment, an input device 1470 is a camera. In an embodiment, an input device 1470 is a digital sound recorder. In an embodiment, an input device 1470 is a camera and a digital sound recorder.

As shown herein, the integrated circuit 1410 may be implemented in a number of different embodiments, including a semiconductor package having an air pressure sensor according to any of the several disclosed embodiments and their equivalents, an electronic system, a computer system, one or more methods of fabricating an integrated circuit, and one or more methods of fabricating an electronic assembly that includes a semiconductor package having an air pressure sensor according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having an air pressure sensor embodiments and their equivalents. A foundation substrate may be included, as represented by the dashed line of FIG. 14. Passive devices may also be included, as is also depicted in FIG. 14.

Embodiments of the present invention include semiconductor packages with air pressure sensors.

In an embodiment, a semiconductor package includes a plurality of build-up layers. A cavity is disposed in one or more of the build-up layers. An air pressure sensor is disposed in the plurality of build-up layers and includes the cavity and an electrode disposed above the cavity.

In one embodiment, the cavity is a hermetically sealed cavity.

In one embodiment, the hermetically sealed cavity is composed of a continuous via ring.

In one embodiment, one or more of the build-up layers having the hermetically sealed cavity disposed therein is an Anjinomoto build-up film (ABF) layer, and the continuous via ring is composed of copper.

In one embodiment, the air pressure sensor includes a MEMS device.

In one embodiment, a diaphragm of the MEMS device includes the cavity, and the electrode includes a suspended portion of the MEMS device.

In one embodiment, the suspended portion of the MEMS device is composed of copper.

In one embodiment, the semiconductor package further includes a layer having a mesh pattern disposed in the cavity, the layer providing structural support for the cavity.

In one embodiment, the semiconductor package further includes a thin metal plate disposed between the cavity and the electrode, the thin metal plate providing structural support for the cavity.

In one embodiment, the cavity provides a reference pressure for the air pressure sensor.

In one embodiment, wherein the semiconductor package further includes a bumpless build-up layer (BBUL) substrate.

In one embodiment, the BBUL substrate is a coreless substrate.

In an embodiment, a semiconductor package, includes a substrate composed of a plurality of build-up layers. A semiconductor die is housed in the substrate. A cavity is disposed in one or more of the build-up layers, above the semiconductor die. An air pressure sensor is disposed in the plurality of build-up layers and includes the cavity and an electrode disposed above the cavity. The electrode is electrically coupled to the semiconductor die. The semiconductor package also includes one or more openings exposing a portion of the air pressure sensor to air pressure ambient to the semiconductor package.

In one embodiment, the substrate is a bumpless build-up layer (BBUL) substrate.

In one embodiment, the BBUL substrate is a coreless substrate.

In one embodiment, the cavity is a hermetically sealed cavity.

In one embodiment, the hermetically sealed cavity is composed of a continuous via ring.

In one embodiment, one or more of the build-up layers having the hermetically sealed cavity disposed therein is an Anjinomoto build-up film (ABF) layer, and the continuous via ring is composed of copper.

In one embodiment, the air pressure sensor includes a MEMS device.

In one embodiment, a diaphragm of the MEMS device includes the cavity, and the electrode includes a suspended portion of the MEMS device.

In one embodiment, the suspended portion of the MEMS device is composed of copper.

In one embodiment, the MEMS device is disposed proximate to an active surface of the semiconductor die and distal from a back surface of the semiconductor die.

In one embodiment, the semiconductor package further includes a layer having a mesh pattern disposed in the cavity, the layer providing structural support for the cavity.

In one embodiment, the semiconductor package further includes a thin metal plate disposed between the cavity and the electrode, the thin metal plate providing structural support for the cavity.

In one embodiment, the cavity provides a reference pressure for the air pressure sensor.

In one embodiment, the semiconductor package further includes a permanent magnet coupled with the air pressure sensor.

In an embodiment, a method of sensing air pressure ambient to a semiconductor package includes determining an extent of capacitive coupling between a diaphragm of an air pressure sensor and an electrode of the air pressure sensor. The diaphragm includes a hermetically sealed cavity disposed below the electrode and in build-up layers of the semiconductor package. The hermetically sealed cavity has a reference pressure. The method also includes correlating the extent of capacitive coupling with a difference between the reference pressure and the ambient pressure.

In one embodiment, the diaphragm reduces the size of the hermetically sealed cavity, and increases a distance between the diaphragm and the electrode, when the ambient air pressure is greater than the reference pressure.

In one embodiment, the diaphragm increases the size of the hermetically sealed cavity, and decreases a distance between the diaphragm and the electrode, when the ambient air pressure is less than the reference pressure.

In one embodiment, the air pressure sensor includes a resonant beam. The method further includes actuating the resonant beam through interaction of an AC current with a permanent magnet. A diaphragm deflection is due to a difference in air pressure and transduces a Z-displacement which applies tension onto the resonant beam and increases a resonant frequency of the resonant beam.

What is claimed is:

1. A semiconductor package, comprising:
   a substrate comprising a plurality of build-up layers;
   a semiconductor die housed in the substrate;
   a cavity disposed in one or more of the build-up layers, above the semiconductor die;
   an air pressure sensor disposed in the plurality of build-up layers and comprising the cavity and an electrode disposed above the cavity, the electrode electrically coupled to the semiconductor die; and
   one or more openings exposing a portion of the air pressure sensor to air pressure ambient to the semiconductor package.

2. The semiconductor package of claim 1, wherein the substrate is a bumpless build-up layer (BBUL) substrate.

3. The semiconductor package of claim 2, wherein the BBUL substrate is a coreless substrate.

4. The semiconductor package of claim 1, wherein the cavity is a hermetically sealed cavity.

5. The semiconductor package of claim 4, wherein the hermetically sealed cavity comprises a continuous via ring.

6. The semiconductor package of claim 5, wherein one or more of the build-up layers having the hermetically sealed cavity disposed therein is an Anjinomoto build-up film (ABF) layer, and wherein the continuous via ring comprises copper.

7. The semiconductor package of claim 1, wherein the air pressure sensor comprises a MEMS device.

8. The semiconductor package of claim 7, wherein a diaphragm of the MEMS device comprises the cavity, and wherein the electrode comprises a suspended portion of the MEMS device.

9. The semiconductor package of claim 8, wherein the suspended portion of the MEMS device comprises copper.

10. The semiconductor package of claim 7, wherein the MEMS device is disposed proximate to an active surface of the semiconductor die and distal from a back surface of the semiconductor die.

11. The semiconductor package of claim 1, further comprising:
    a layer having a mesh pattern disposed in the cavity, the layer providing structural support for the cavity.

12. The semiconductor package of claim 1, further comprising:
    a thin metal plate disposed between the cavity and the electrode, the thin metal plate providing structural support for the cavity.

13. The semiconductor package of claim 1, wherein the cavity provides a reference pressure for the air pressure sensor.

14. The semiconductor package of claim 1, further comprising:
    a permanent magnet coupled with the air pressure sensor.

* * * * *